(12) United States Patent
Albee

(10) Patent No.: US 10,009,449 B1
(45) Date of Patent: *Jun. 26, 2018

(54) SUPPORT STRUCTURE TO ENABLE USE OF TABLET COMPUTER BY PERSONS WITH LIMITED MANUAL DEXTERITY

(71) Applicant: Jeffrey M. Albee, Franklin, TN (US)

(72) Inventor: Jeffrey M. Albee, Franklin, TN (US)

(*) Notice: Subject to any disclaimer, the term of this patent is extended or adjusted under 35 U.S.C. 154(b) by 0 days. days.

This patent is subject to a terminal disclaimer.

(21) Appl. No.: 15/401,799

(22) Filed: Jan. 9, 2017

Related U.S. Application Data

(63) Continuation of application No. 14/873,468, filed on Oct. 2, 2015, now Pat. No. 9,577,694.

(Continued)

(51) Int. Cl.
| | |
|---|---|
| *H04M 1/00* | (2006.01) |
| *H04M 1/02* | (2006.01) |
| *H04B 1/3877* | (2015.01) |
| *G06F 1/16* | (2006.01) |
| *H05K 5/00* | (2006.01) |

(52) U.S. Cl.
CPC .......... *H04M 1/0279* (2013.01); *G06F 1/16* (2013.01); *H04B 1/3877* (2013.01); *H05K 5/00* (2013.01)

(58) Field of Classification Search
USPC ............... 455/575.1; 361/679.1, 686, 679.43
See application file for complete search history.

(56) References Cited

U.S. PATENT DOCUMENTS 6,118,848 A * 9/2000 Reiffel ................ A61N 5/1049
378/162
7,289,316 B2 10/2007 Feret
(Continued)

FOREIGN PATENT DOCUMENTS

| DE | 102012100602 A1 | 7/2013 |
| WO | 2012100137 A1 | 7/2012 |

OTHER PUBLICATIONS iPad 1 Case—Product No. 1555—Independent Life—Media/Adapted Electronics, Independent Life Technologies, Retrieved Jan. 6, 2014, from http://independent-life-technologies.co.uk/Home_page/Media/iPad_accessories.html , on p. 4 of 7.

(Continued)

*Primary Examiner* — Ganiyu A Hanidu
(74) *Attorney, Agent, or Firm* — Patterson Intellectual Property Law, P.C.; Jerry Turner Sewell

(57) ABSTRACT

A system and method provide a stable support for a portable electronic device such as a tablet computer, a personal digital assistant, a smartphone, or the like. The system includes a support structure that rests on a table, a tray or other platform positioned proximate to a person using the portable electronic device. The support structure has a non-skid base positioned on the platform and has an upper surface positioned at a selected angle with respect to the base. The upper surface includes a recess that receives a configuration frame (or insert). The configuration frame includes an opening to receive and retain the portable electronic device. The configuration frame is rotatable to at least two positions to orient the portable electronic device in at least two orientations (e.g., portrait and landscape) with respect to the person. In certain embodiments, the presentation angle of the upper surface is variable.

11 Claims, 31 Drawing Sheets

Related U.S. Application Data

(60) Provisional application No. 62/100,235, filed on Jan. 6, 2015.

(56) References Cited

U.S. PATENT DOCUMENTS

| | | | |
|---|---|---|---|
| 7,293,507 | B2 | 11/2007 | DePue et al. |
| 7,428,143 | B1 | 9/2008 | Jones et al. |
| 7,971,929 | B2 | 7/2011 | Kennard et al. |
| 8,093,486 | B2 | 1/2012 | Behringer et al. |
| 8,369,082 | B2 | 2/2013 | Madonna et al. |
| 2003/0137584 | A1* | 7/2003 | Norvell ............... B60R 11/0235 348/61 |
| 2006/0104734 | A1* | 5/2006 | Mathis .................... B23B 39/04 408/236 |
| 2008/0041282 | A1 | 2/2008 | Goschy et al. |
| 2012/0060724 | A1 | 3/2012 | Doss et al. |
| 2012/0075789 | A1 | 3/2012 | DeCamp et al. |
| 2012/0119614 | A1* | 5/2012 | Gutierrez ............... G02B 7/102 310/300 |
| 2012/0199622 | A1 | 8/2012 | Palmer et al. |
| 2012/0261539 | A1 | 10/2012 | Huang |
| 2013/0048802 | A1 | 2/2013 | Guran |
| 2013/0058022 | A1* | 3/2013 | Knutson ............... G06F 1/1632 361/679.01 |
| 2013/0093220 | A1 | 4/2013 | Pajic |
| 2013/0109253 | A1 | 5/2013 | Gammon et al. |
| 2013/0175426 | A1* | 7/2013 | Harjani ................ F16M 11/041 248/688 |
| 2013/0210317 | A1 | 8/2013 | Hageman et al. |
| 2014/0098478 | A1* | 4/2014 | Gallagher ............ F16M 11/105 361/679.02 |
| 2015/0288405 | A1* | 10/2015 | Gygax .................... H04M 1/04 455/575.1 |

OTHER PUBLICATIONS

Lap Tables—A guide to the top brands of lap tables, desk, trays. Retrieved Jan. 9, 2014, from http://lap-table.com/, 2 pages.
Trabasack—iPad Mount for Wheelchairs—Options from Trabasack, Retrieved Jan. 8, 2014, from http://www.wheelchairlaptrays.com/wheelchair/wheelchair-tray-accessories, 2010, 10 pages.

* cited by examiner

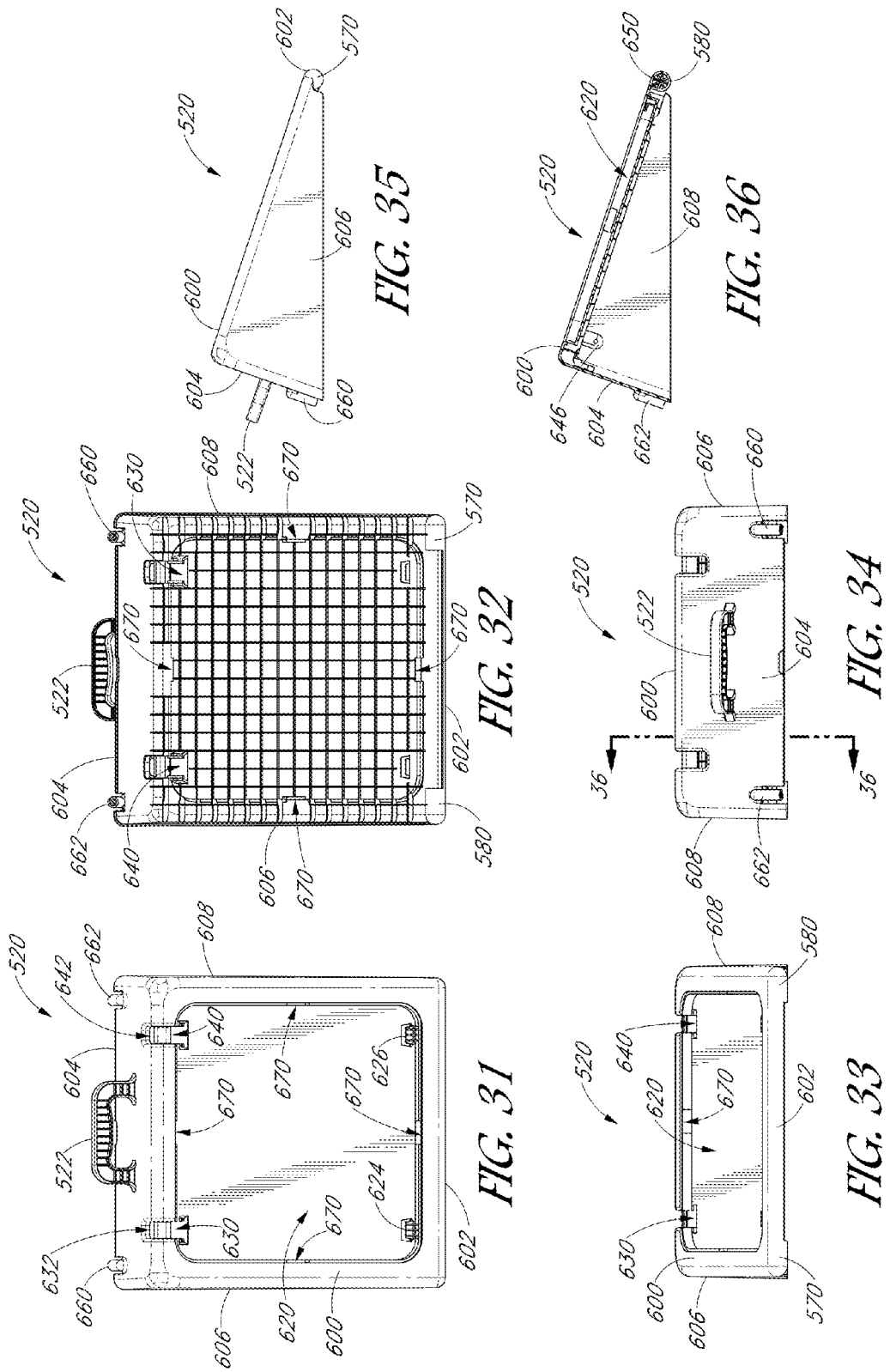

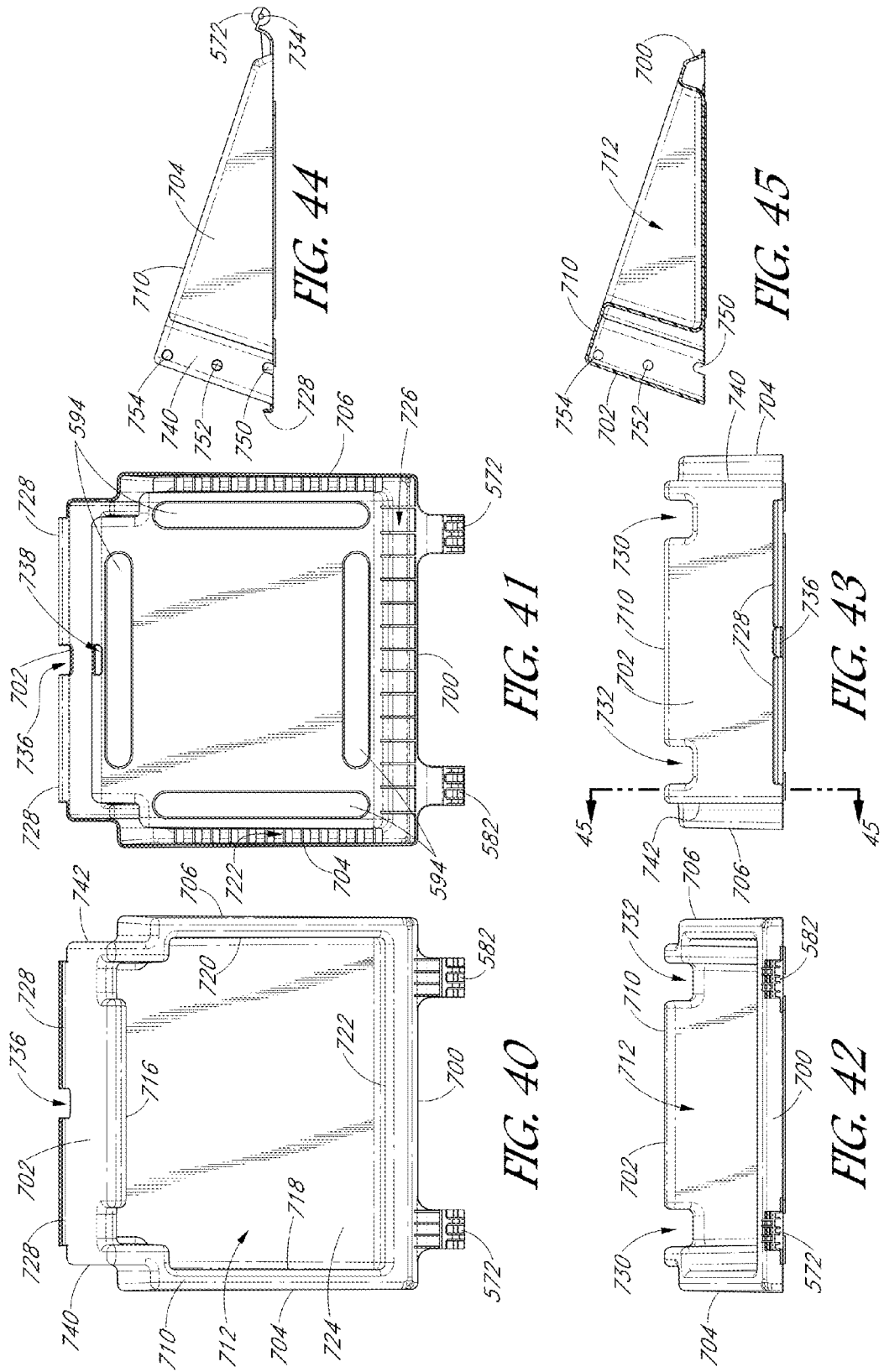

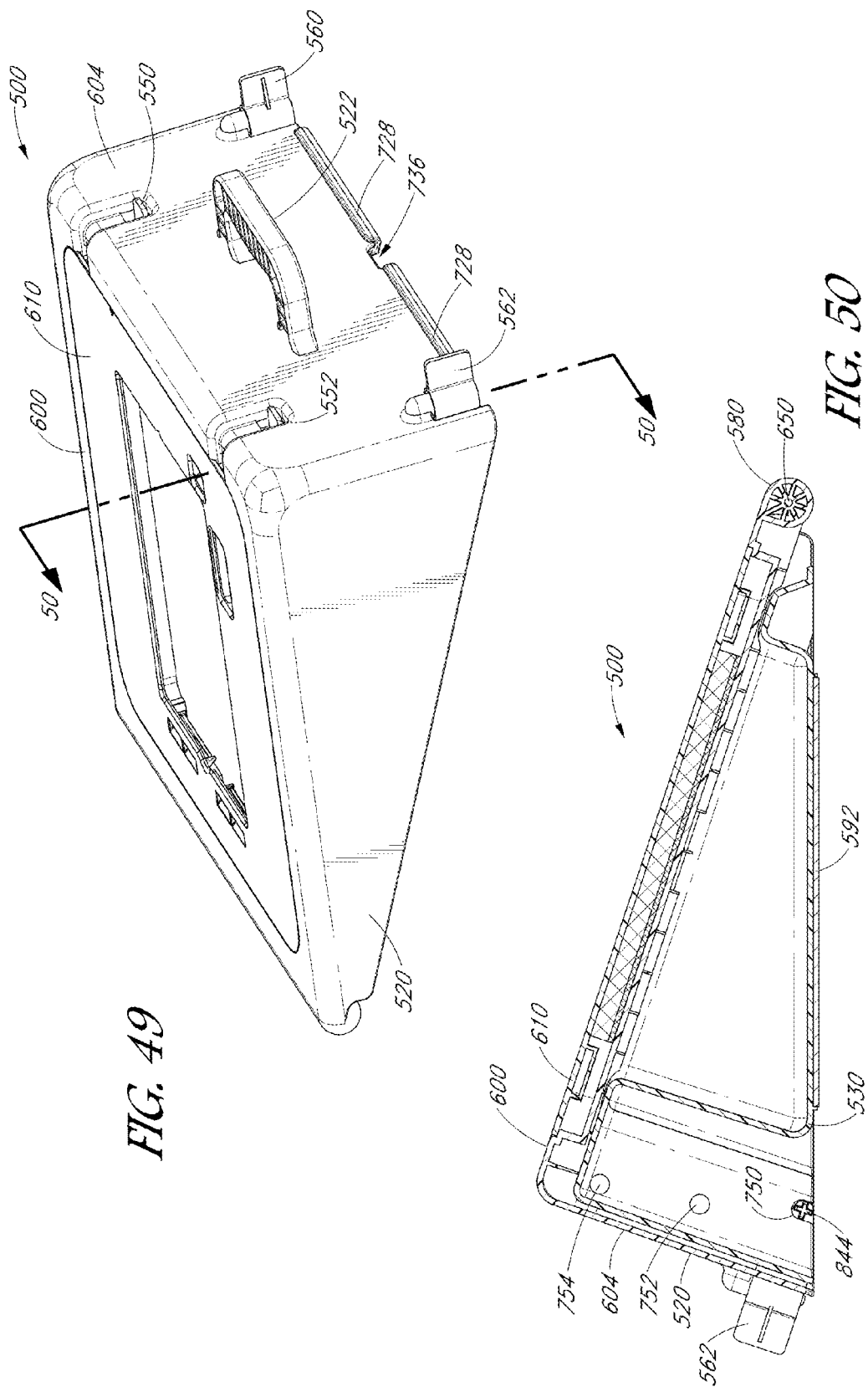

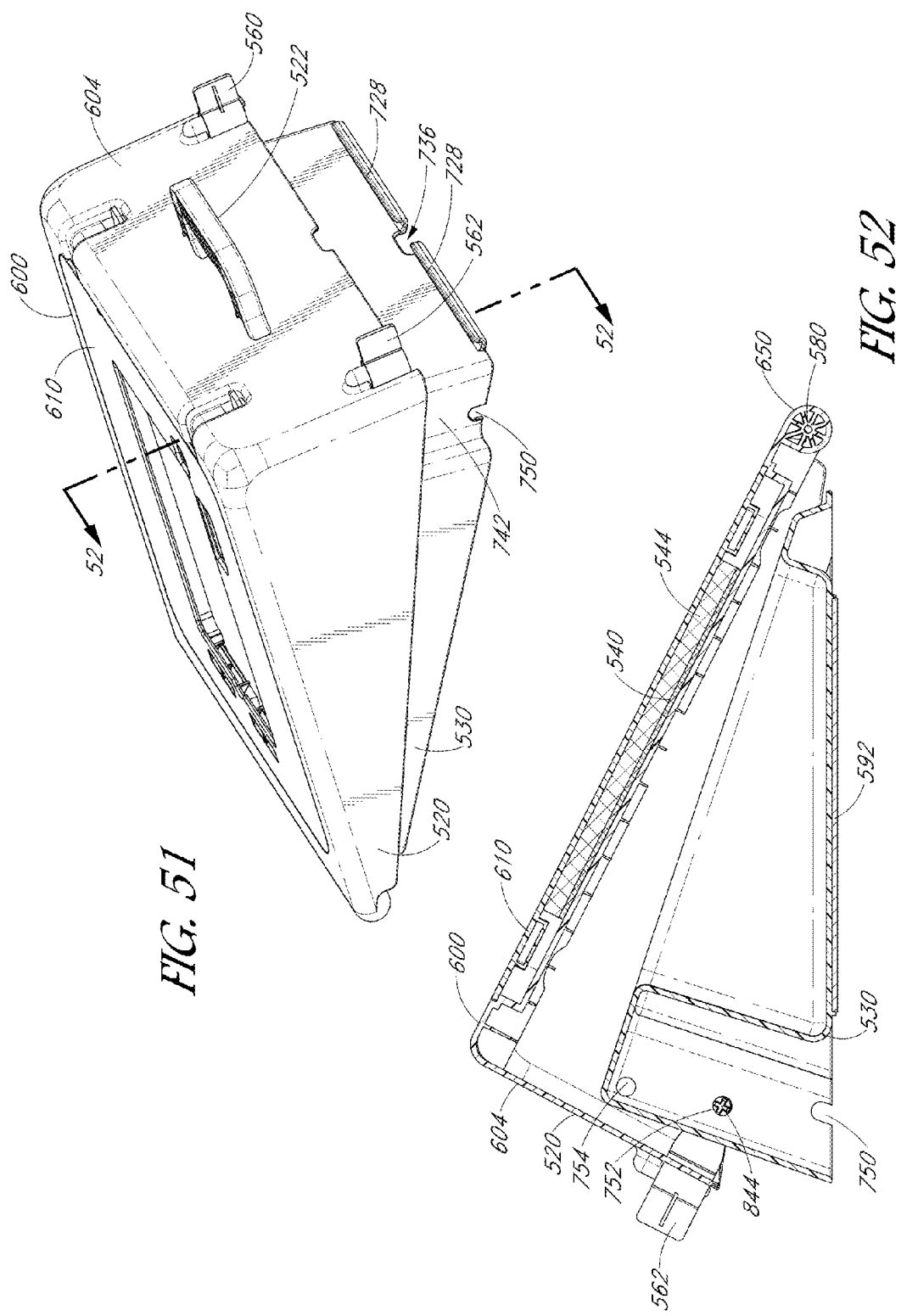

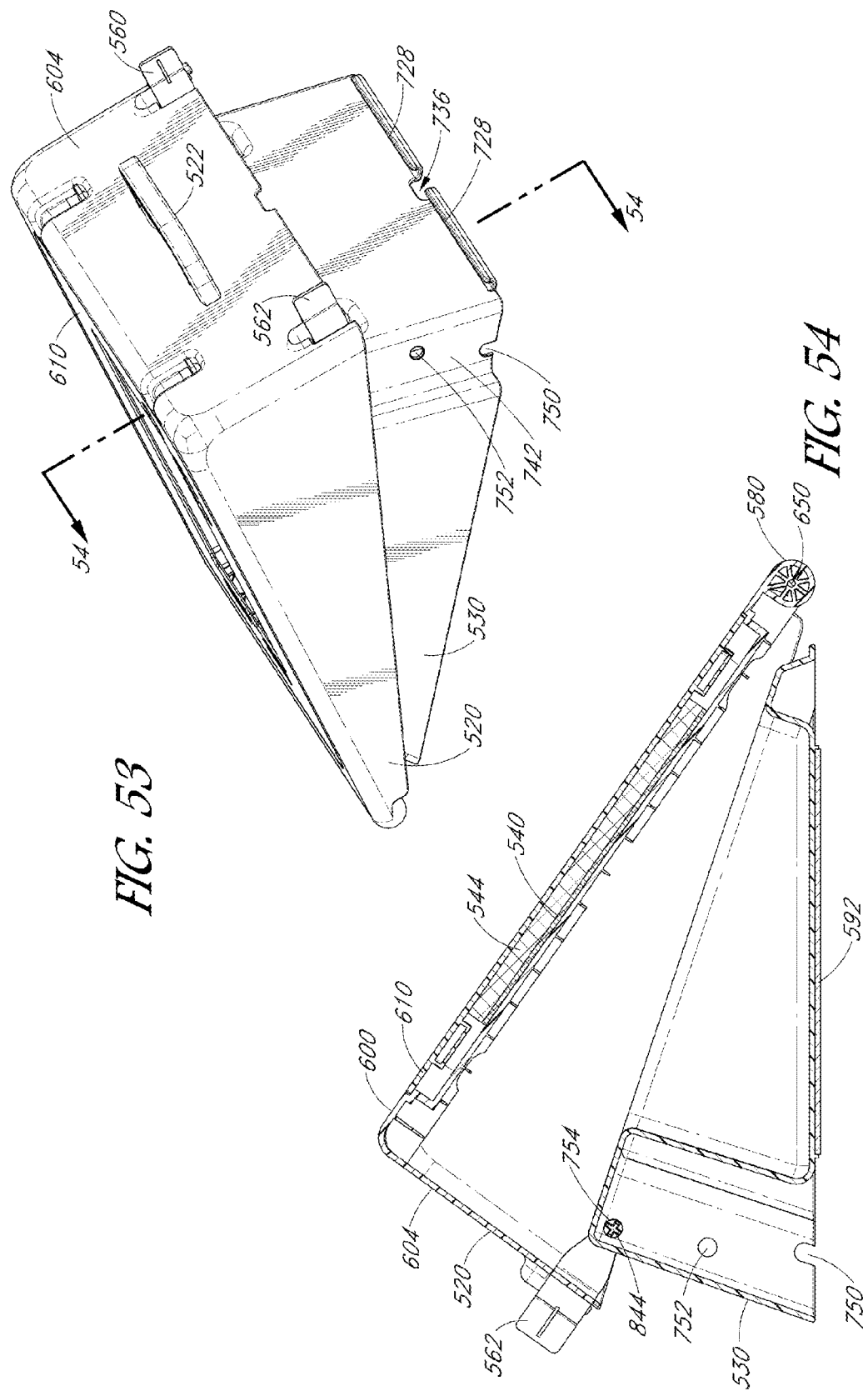

SUPPORT STRUCTURE TO ENABLE USE OF TABLET COMPUTER BY PERSONS WITH LIMITED MANUAL DEXTERITY

RELATED APPLICATIONS

This application is a continuation of U.S. patent application Ser. No. 14/873,468 filed on Oct. 2, 2015, for "Support Structure to Enable Use of Tablet Computer by Persons with Limited Manual Dexterity," which application claims the benefit of U.S. Provisional Application No. 62/100,235 filed on Jan. 6, 2015, for "Support Structure to Enable Use of Tablet Computer by Persons with Limited Manual Dexterity." The provisional application and the nonprovisional application are incorporated by reference herein.

BACKGROUND OF THE INVENTION

Field of the Invention

The present invention is in the field of accessibility devices to enable use of electronics devices by persons with limited manual dexterity.

Description of the Related Art

Tablet computers, personal digital assistants (PDAs), smartphones and other portable electronic devices have quickly become ubiquitous among people of all age groups. Because of the small sizes, fragility and relatively high costs, the use of such devices tends to be foreclosed to people having limited manual dexterity. For example, when using certain programs or applications ("apps") on such a portable device, a person often has to hold the device in one or both hands while operating the device with the thumbs. When using other programs or apps, a person has to swipe his or her fingers across the touch-responsive surface of the device. Although such activities are quite easy for people with full manual ability, the activities are not easy for some people with limited manual dexterity. For example, person with rheumatoid arthritis of the hands, cerebral palsy or other conditions affecting the hands may not be able to grip the portable device. A person with certain conditions may have involuntary movements that could cause the portable device to be dropped or moved out of position. Thus, some people are frustrated by the lack of control over the devices. Other people may face expensive repair or replacement of the devices.

SUMMARY OF THE INVENTION

An aspect of embodiments disclosed herein is a system and method that enable persons with impaired manual dexterity to use tablet computers, PDAs, smartphones and other small portable electronic devices with greater enjoyment, with greater functionality and with less likelihood of breakage.

In an illustrated embodiment, the system and method provide a stable support for a portable electronic device such as a tablet computer, a personal digital assistant, a smartphone, or the like. The system includes a support structure that rests on a table, a tray or other platform positioned proximate to a person using the portable electronic device. For example, the table, tray or platform may be attached to or supported by a wheelchair, another type of chair or a bed so that a person can access the device supported by the support structure. The support structure has a non-skid base positioned on the platform and has an upper surface positioned at a selected angle with respect to the base. The upper surface includes a recess that receives a configuration (or positioning) structure (or insert). The configuration structure includes an opening to receive and retain the portable electronic device. The configuration structure is rotatable to at least two positions to orient the portable electronic device in at least two orientations (e.g., portrait and landscape) with respect to the person.

An aspect of embodiments disclosed herein is support structure for a portable electronic device that retains the portable electronic device in at least two orientations. The support structure comprises a base. A front wall, a rear wall, a left side wall and a right side wall extend upwardly from the base. The front wall is shorter than the rear wall. An upper surface is supported by the front wall, the rear wall, the left side wall and the right side wall. The upper surface slopes downward from the rear wall toward the front wall such that the upper surface is at a presentation angle with respect to the base. A positioning structure receiving recess is formed in the upper surface. The positioning structure receiving recess has a selected shape. A device positioning structure is positionable in the positioning structure receiving recess. The device positioning structure includes a device receiving opening having a shape configured to conform to the portable electronic device. The device positioning structure is positionable in the positioning structure receiving recess to provide at least two orientations for the device receiving opening with respect to the front wall such that the portable electronic device is positionable in at least two corresponding orientations with respect to the front wall. In certain embodiments, the presentation angle is approximately 5-45 degrees. In certain embodiments, the presentation angle is approximately 10-15 degrees. In certain embodiments, the presentation angle is variable between a lowest presentation angle and a highest presentation angle by rotating the upper surface with respect to the base. In particular embodiments, the presentation angle is selectively fixed at one of three presentation angles, including the lowermost presentation angle, the uppermost presentation angle and a middle presentation angle.

In certain embodiments, the device positioning structure has a substantially square shape; and the device receiving opening is positioned substantially in the center of the substantially square shape. Preferably, the device receiving opening is generally rectangular with a length and a width, wherein the width shorter than the length. Preferably, the device positioning structure is positionable in the positioning structure receiving recess in a first orientation with the length of the device receiving opening parallel to the front wall, and is positionable in the positioning structure receiving recess in a second orientation with the width of the device receiving opening parallel to the front wall. In preferred embodiments, the device positioning structure is sufficiently larger than the device receiving opening such that the device positioning structure provides a surrounding perimeter surface onto which a person may rest his or her hands when not accessing the device within the device receiving opening.

In certain embodiments, the device positioning structure has a substantially square shape, and the device positioning structure comprises an outer structure portion and an inner structure portion. The outer structure portion has a central opening formed therein. The structure frame portion has an outer perimeter sized and shaped to conform to and fit within the central opening of the outer structure portion. The device receiving opening is positioned substantially in the center of the inner structure portion, and the device receiving opening is generally rectangular with a length and a width, wherein the width shorter than the length. The inner structure portion is positionable within the outer structure portion in at least a first orientation with the length of the device receiving opening parallel to the front wall, at least a second orientation with the width of the device receiving opening parallel to the front wall, and at least a third orientation with the length of the device receiving opening at an angle such that neither the length of the device receiving opening nor the width of the device receiving opening is parallel to the front wall.

In certain embodiments, the central opening of the outer structure portion and the outer perimeter of the inner structure portion are substantially circular; and the inner structure portion is fully positionable within the outer structure portion such that the length of the device receiving opening is rotatable to any angle with respect to the front wall.

In certain embodiments, the base comprises a lower base portion that rests on a flat surface, and an upper base portion that engages the lower base portion. Preferably, the lower base portion includes a lower recess. A non-skid pad is removably insertable within the lower recess of the lower base portion to enhance the frictional engagement of the lower base portion with the flat surface. Also preferably, the lower base portion comprises an extended upper portion. The upper base portion includes a lower recess. The lower recess of the upper base portion is sized and shaped to engage the extended upper portion of the lower base portion.

In certain embodiments, the device positioning structure comprises at least one pad defining an opening to receive the device within the opening. A faceplate is positionable over the at least one pad and is engageable with the upper surface. The faceplate has a faceplate opening sized smaller than the opening in the at least one pad. The faceplate has a frame around the faceplate opening sized to contact an upper surface of the device to secure the device within the positioning structure receiving recess of the upper surface of the support structure.

Another aspect of embodiments disclosed herein is a support structure that retains a manually accessible apparatus in at least two orientations. The support structure comprises a base and comprises a front wall, a rear wall, a left side wall and a right side wall that extend upwardly from the base. The front wall is shorter than the rear wall. An upper surface is supported by the front wall, the rear wall, the left side wall and the right side wall. The upper surface slopes downward from the rear wall toward the front wall such that the upper surface is at a presentation angle with respect to the base. A positioning structure receiving recess is formed in the upper surface. The positioning structure receiving recess has a selected shape. An apparatus positioning structure is positionable in the positioning structure receiving recess. The apparatus positioning structure includes an apparatus receiving opening having a shape configured to conform to the manually accessible apparatus. The apparatus positioning structure is positionable in the positioning structure receiving recess to provide at least two orientations for the apparatus receiving opening with respect to the front wall such that the manually accessible apparatus is positionable in at least two corresponding orientations with respect to the front wall.

BRIEF DESCRIPTION OF THE DRAWINGS

Embodiments in accordance with aspects of the present invention are described below in connection with the attached drawings in which:

FIG. 31 illustrates a top plan view of the outer shell of FIG. 27;

FIG. 32 illustrates a bottom plan view of the outer shell of FIG. 27;

FIG. 33 illustrates a front elevational view of the outer shell of FIG. 27;

FIG. 34 illustrates a rear elevational view of the outer shell of FIG. 27;

FIG. 35 illustrates a left elevational view of the outer shell of FIG. 27, the right elevational view (not shown) being a mirror image of the left elevational view;

FIG. 36 illustrates a cross-sectional elevational view of the outer shell of FIG. 27 taken along the line 36-36 in FIG. 34;

FIG. 40 illustrates a top plan view of the inner shell of FIG. 37;

FIG. 41 illustrates a bottom plan view of the inner shell of FIG. 37;

FIG. 42 illustrates a front elevational view of the inner shell of FIG. 37;

FIG. 43 illustrates a rear elevational view of the inner shell of FIG. 37;

FIG. 44 illustrates a left elevational view of the inner shell of FIG. 37, the right elevational view (not shown) being a mirror image of the left elevational view;

FIG. 45 illustrates a cross-sectional elevational view of the inner shell of the support structure of FIG. 37 taken along the line 45-45 in FIG. 43;

FIG. 49 illustrates a top distal right perspective view of the support structure of FIG. 18 showing the outer shell in the lowermost elevational (angular) position;

FIG. 50 illustrates a cross-sectional elevational view of the support structure of FIG. 49 looking from the left toward the right along the section line 50-50 in FIG. 49;

FIG. 51 illustrates a top distal right perspective view of the support structure of FIG. 18 showing the outer shell in the middle elevational (angular) position;

FIG. 52 illustrates a cross-sectional elevational view of the support structure of FIG. 51 looking from the left toward the right along the section line 52-52 in FIG. 51;

FIG. 53 illustrates a top distal right perspective view of the support structure of FIG. 18 showing the outer shell in the uppermost elevational (angular) position;

FIG. 54 illustrates a cross-sectional elevational view of the support structure of FIG. 53 looking from the left toward the right along the section line 54-524 in FIG. 53;

DETAILED DESCRIPTION OF PREFERRED EMBODIMENTS

Figure 1:
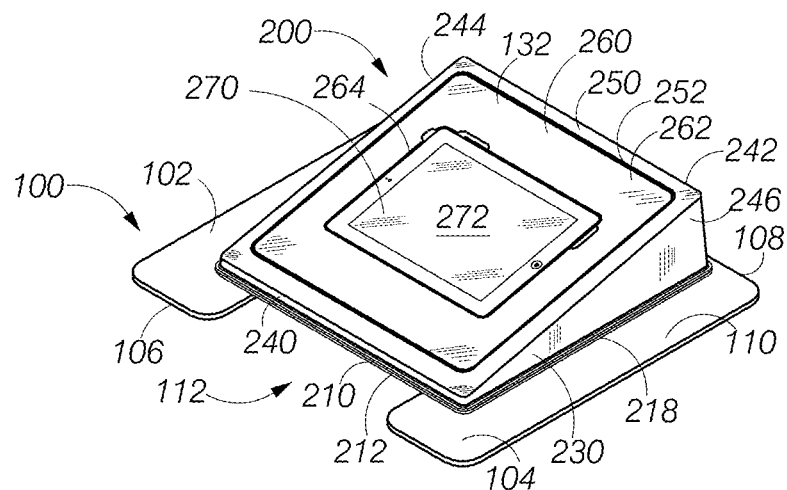
FIG. 1 illustrates a perspective view of a support structure for a portable electronic device (e.g., a tablet computer) positioned on an accessory desk, the support structure configured to retain the portable electronic device in a landscape orientation with respect to a user (not shown)

The support structure for portable electronic device is disclosed herein with respect to exemplary embodiments of a system and a method. The embodiments are disclosed for illustration of the system and the method and are not limiting except as defined in the appended claims. Although the following description is directed to a support structure that provides a stable platform for portable electronic devices used by persons with manual dexterity issues, the support structure may also be used to by other persons needing a stable platform for such devices. Dimensions are provided herein as examples of an illustrated embodiment. It should be understood that the dimensions are for illustrative purposes and are not intended to limit the scope of the invention unless specifically noted. It should be understood that many of the shape intersections between the described surfaces are smoothed with fillets. Such fillets are shown in the drawings, but are not specifically described herein.

Figure 2:
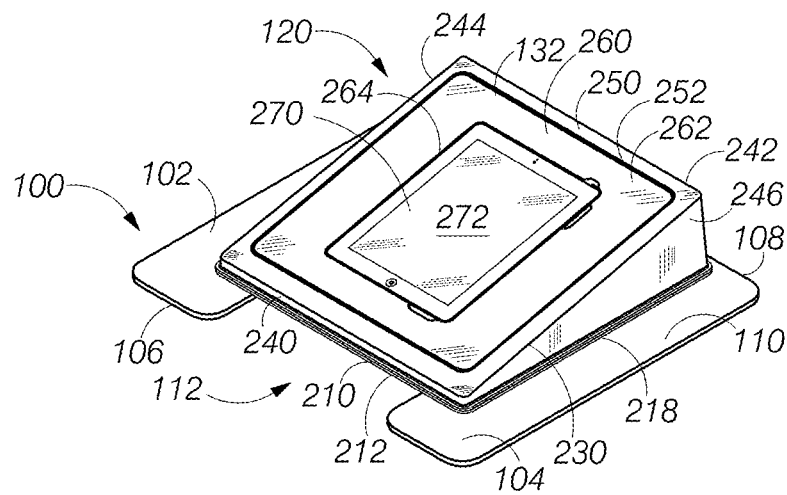
FIG. 2 illustrates a perspective view of the support structure of FIG. 1 with the support structure configured to retain the portable electronic device in a portrait configuration.

FIGS. 1 and 2 illustrate a partial view of an accessory desk (or table) 100 that may be used with a support structure 200 also shown in FIGS. 1 and 2. The illustrated accessory desk is generally rectangular and includes a left portion 102, a right portion 104, a front edge 106 and a rear edge 108. Basically, the accessory desk provides a generally flat upper surface 110 that supports everyday items such as dishes, books, papers, toys, or the like, so that the items are readily accessible to a person (not shown) located proximate to the accessory desk. For example, the accessory desk may be part of a wheelchair, may be the upper portion of a bed table or may be the upper portion of a conventional self-standing table having legs. The accessory desk shown in FIGS. 1 and 2 is configured for a wheelchair (not shown) and includes a cutout 112 along the front edge 106 closer to a person seated in the wheelchair so that the desk can be moved close to the torso of the person to enable the person to reach objects on the accessory desk.

Embodiments of the portable electronic device support structure 200 are illustrated in FIGS. 1-16. In FIGS. 1 and 2, the support structure is positioned on the upper surface 110 the accessory desk 100 in a position accessible by a person (not shown) located proximate the front edge of the accessory desk.

The support structure 200 includes a base portion 210 that rests on the upper surface 110 of the accessory desk 100. As shown for example in FIGS. 3 and 6-8, the base portion has a front edge 212, a rear edge 214, a left edge 216 and a right edge 218. In the illustrated embodiment, the base portion has a generally square configuration as defined by the four edges. It should be understood that other configurations (e.g., non-square rectangular configurations, circular configurations, other polyhedral configurations, and the like) may also be used. In the illustrated embodiment, each of the four edges has a length of approximately 15 inches. The front edge of the base portion is usually positioned in approximate alignment with the front edge 106 of the accessory desk.

The base portion 210 supports an upper shell portion 230. As shown for example in FIGS. 3 and 9-12, the upper shell portion has a front wall 240, a rear wall 242, a left side wall 244 and a right side wall 246 that form a lower portion having dimensions generally corresponding to the dimensions of the base portion (e.g., approximately 15 inches by 15 inches in the illustrated embodiment). In the illustrated embodiment, the front wall of the upper shell portion has an overall height of approximately 0.75 inch, and the rear wall has an overall height of approximately 4 inches such that the top edges of the left side wall and the right side wall slope downwardly towards the front wall at a presentation angle in a range of approximately 5-45 degrees, and more particularly in a range of approximately 10-15 degrees. The four walls of the upper shell portion support an upper surface 250 that is inclined downwardly from the rear wall toward the front wall at the presentation angle so that the upper surface is directed toward and is accessible to a person (not shown) positioned proximate to the front edge 106 of the accessory desk 100 shown in FIGS. 1 and 2.

As further shown in FIGS. 1-3, 9 and 12 the upper surface 250 of the support structure 200 includes a recess 252 that receives a device positioning frame (device positioning structure) 260 in first orientation shown in FIG. 1 and in a second orientation shown in FIG. 2. The device positioning frame includes an upper surface 262. A central receiving opening 264 is formed in the upper surface to receive and position a portable electronic device 270. The portable electronic device includes a conventional display/input panel 272 which is positioned parallel to and generally coplanar with the upper surface of the support structure. Thus, the display/input panel of the portable electronic device is oriented toward a person positioned in the selected presentation angle (e.g., approximately 10-15 degrees in the illustrated embodiment).

Although the illustrated embodiment provides a presentation angle of approximately 10-15 degrees as determined by the slope of the upper surface 250 of the support structure 200, it should be understood that the presentation angle can very over a wide range. For example, the presentation angle can vary from approximately 5 degrees to approximately 45 degrees. The choice of the presentation angle is based in part on the resulting aesthetics of the support structure and based in part on ease of use. A greater presentation angle results in a greater height differential between the front wall and the rear wall, which may not be as aesthetically pleasing for some users. A smaller presentation angle may not allow the portable electronic device 270 to be as easy to view, particularly if a person is relatively short with respect to the upper surface 110 of the accessory desk 100. In general, a presentation angle in a range of approximately 10 to approximately 15 degrees may result in an acceptable combination of aesthetics and ease of use.

In FIG. 1, the portable electronic device 270 is positioned with the display/input panel 272 in a landscape orientation with respect to a person (not shown) seated proximate the accessory desk 100. In FIG. 2, the portable electronic device is positioned with the display/input panel in a portrait orientation with respect to the person. One skilled in the art will appreciate that "landscape" and "portrait" orientations are used herein in a conventional manner such that when the portable electronic device is in the landscape orientation (FIG. 1), the longer edge of the device is parallel to the front wall 240 of the support structure 200. When the portable electronic device is in the portrait orientation (FIG. 2), the shorter edge of the device is parallel to the front wall of the support structure. As described in detail below, the device positioning frame 260 of the support structure provides a system and method to quickly and easily change the orientation of the portable electronic device between the two orientations. As further described below, alternative embodiments of the device positioning frame allow the portable electronic device to be positioned in additional orientations.

Figure 3:
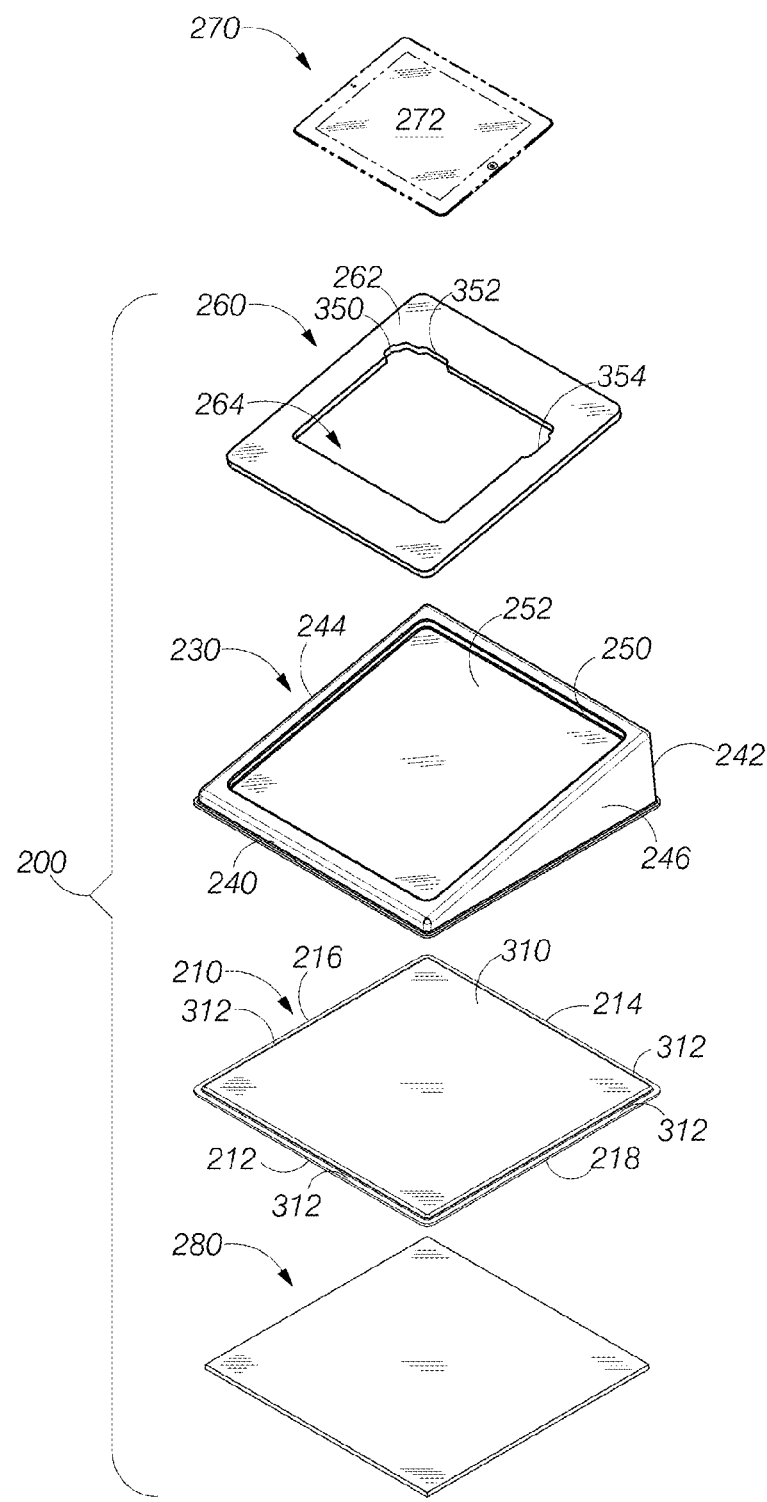
FIG. 3 illustrates an exploded perspective view of the support structure of FIGS. 1 and 2 showing, from bottom to top, a non-skid pad, a lower base portion, an upper shell portion and a device positioning frame, the view further showing the portable electronic device (in phantom) for reference.
Figure 4:
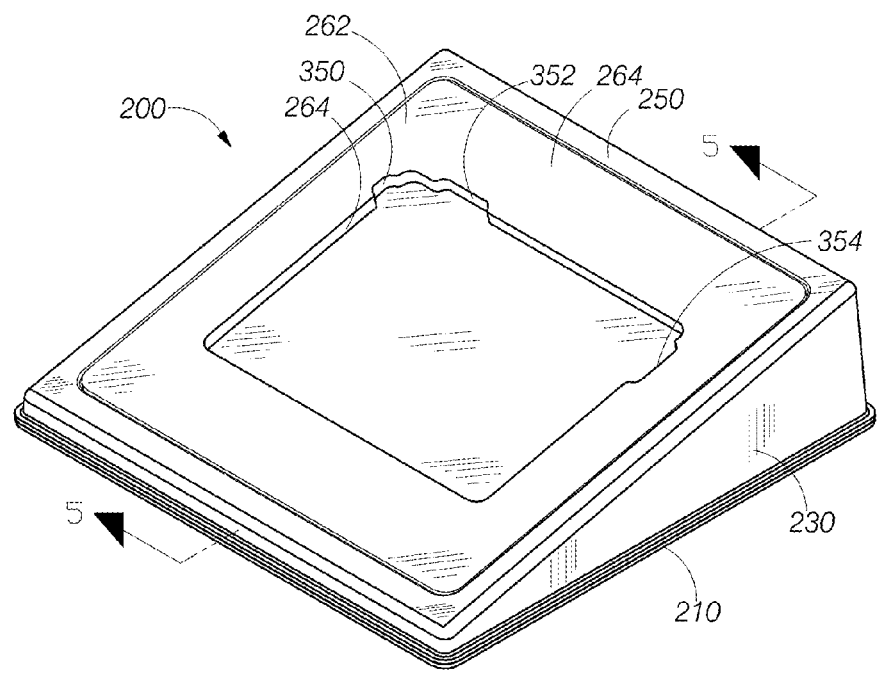
FIG. 4 illustrates a perspective view of the assembled support structure.

As shown in the exploded view of FIG. 3, the support structure 200 comprises the base portion 210, the upper shell portion 230 and the positioning frame 260, as described above. The support structure further includes a non-skid pad 280 that is inserted into the base portion, as described below. The assembled support structure is shown in a perspective view in FIG. 5 and in a cross-sectional view in FIG. 5. In FIG. 3, the portable electronic device 270 is shown in phantom for reference; however, it should be understood that the portable electronic device is not an element of the support structure.

Figure 5:
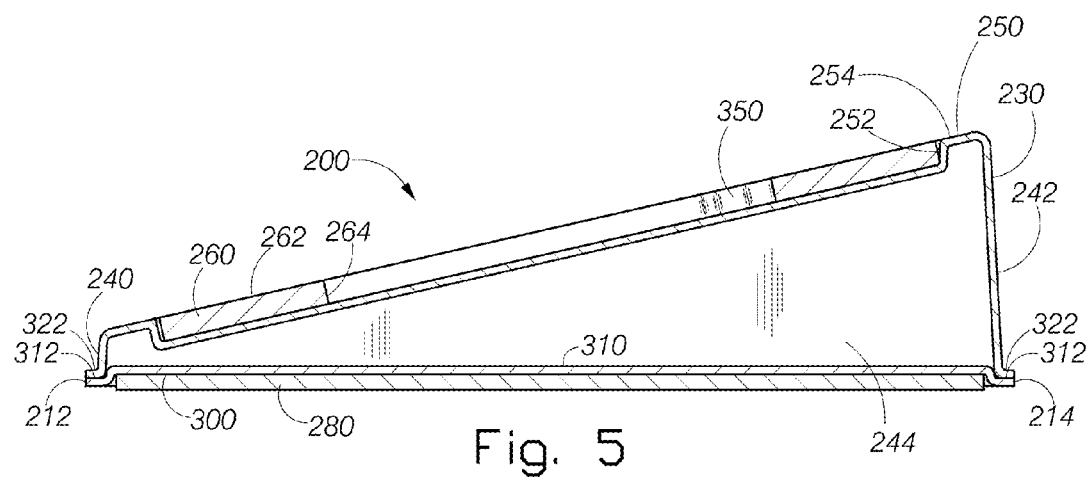
FIG. 5 illustrates a right cross-sectional elevational view of the assembled support structure taken along the section line 5-5 in FIG. 4.
Figure 6:
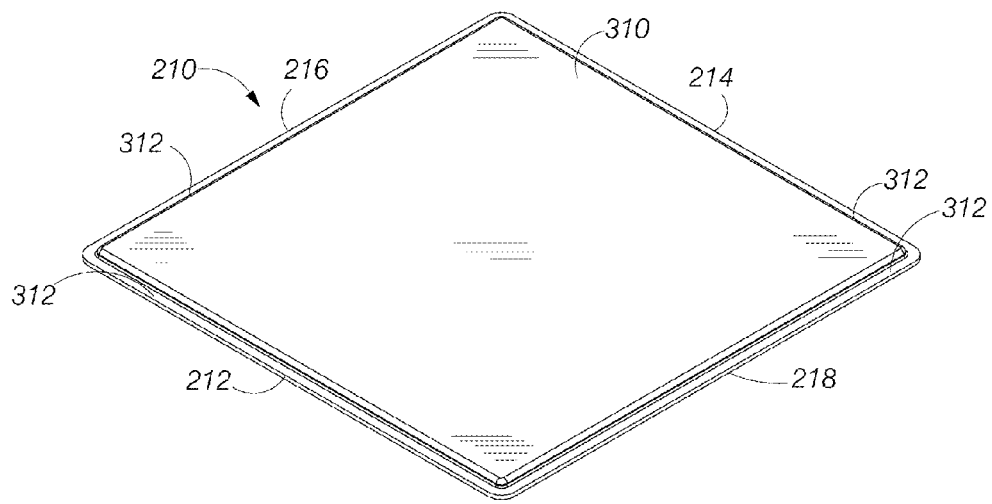
FIG. 6 illustrates a perspective view of the base portion of the support structure of FIG. 4 viewed from the top to show the tapered upper extended portion that engages the upper shell portion of the support structure when assembled as shown in FIGS. 4 and 5.
Figure 7:
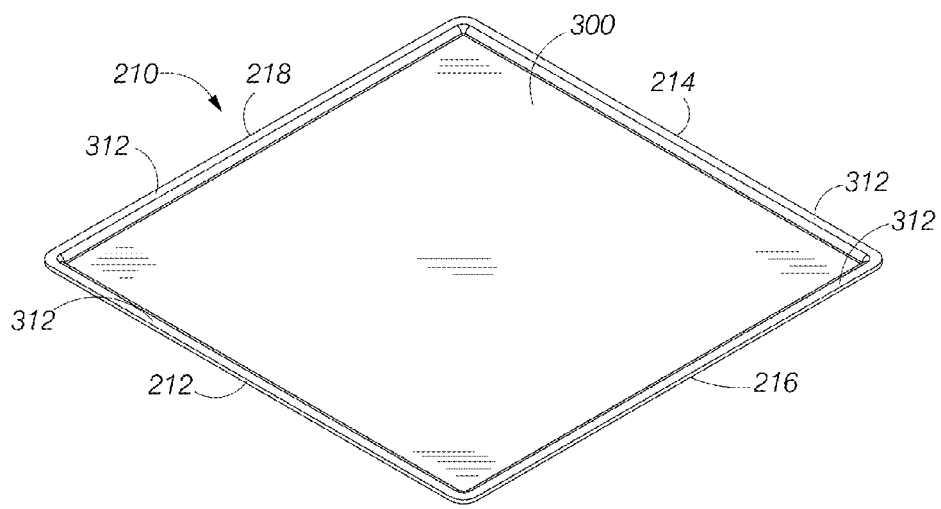
FIG. 7 illustrates a perspective view of the base portion of FIG. 6 viewed from the bottom to show the lower recess for receiving the non-skid pad of FIG. 3.
Figure 8:
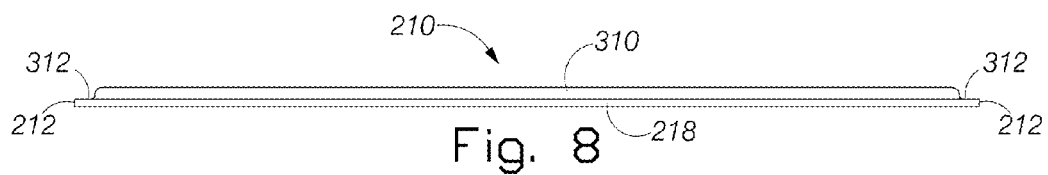
FIG. 8 illustrates a right side elevational view of the base portion of FIG. 6.
Figure 9:
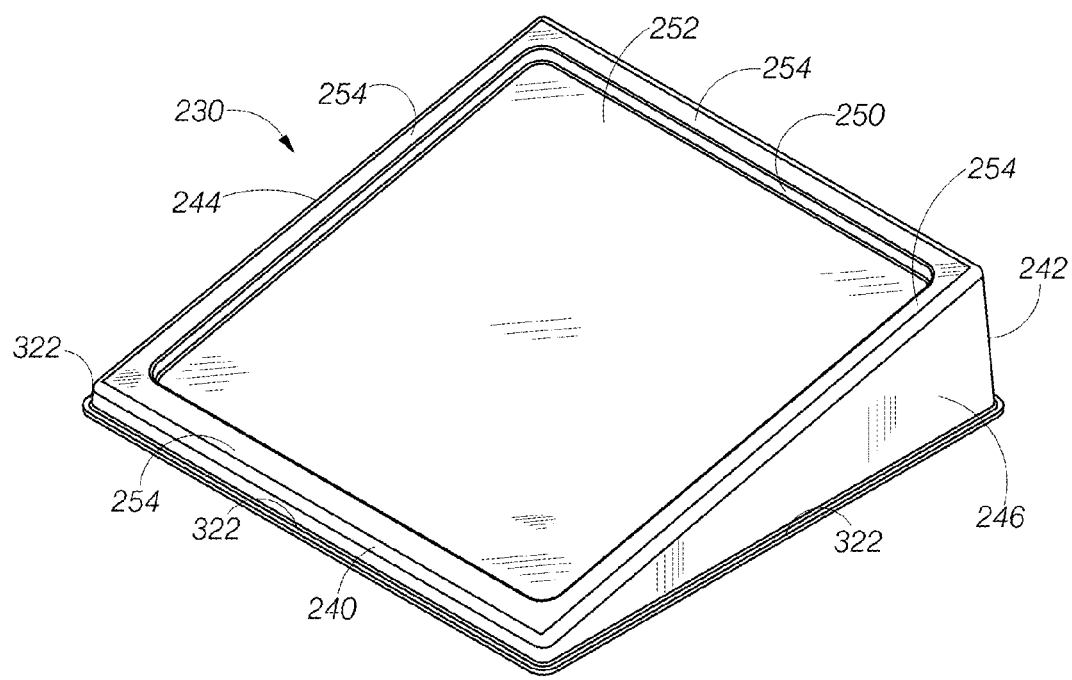
FIG. 9 illustrates a perspective view of the upper shell portion of the support structure of FIG. 4 viewed from the top.
Figure 10:
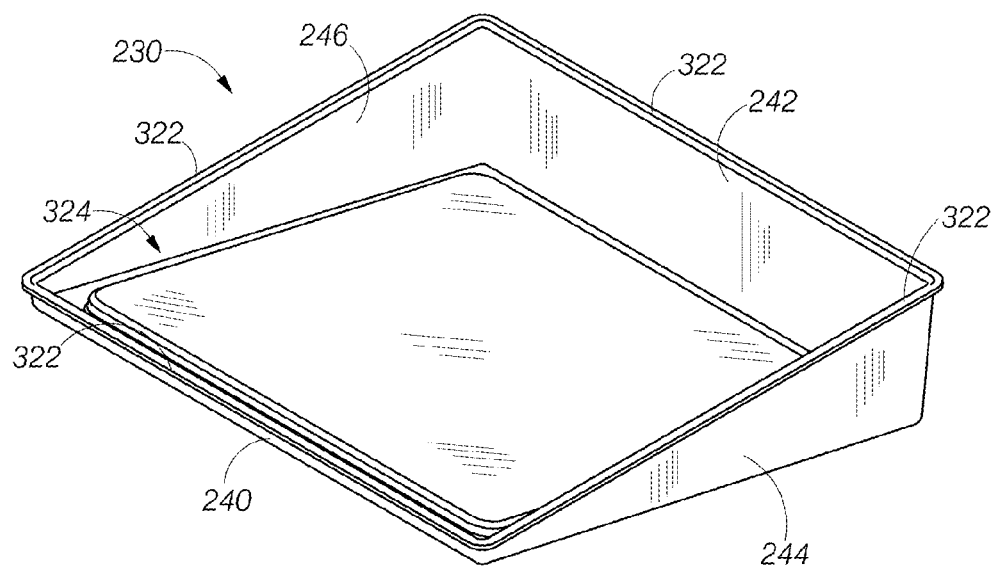
FIG. 10 illustrates a perspective view of the upper shell portion of FIG. 9 showing the hollow inner cavity that engages the tapered upper extended portion of the base portion of the support structure.
Figure 11:
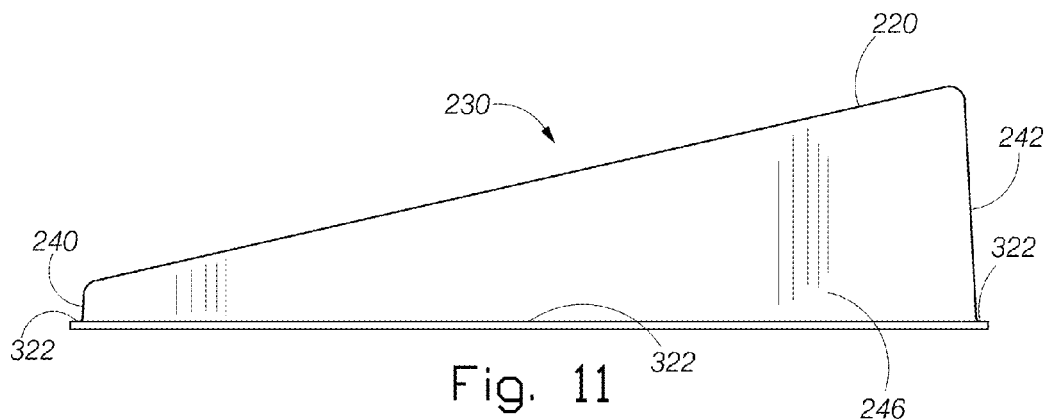
FIG. 11 illustrates a right side elevational view of the upper shell portion of FIG. 9 showing the inclined side wall.
Figure 12:
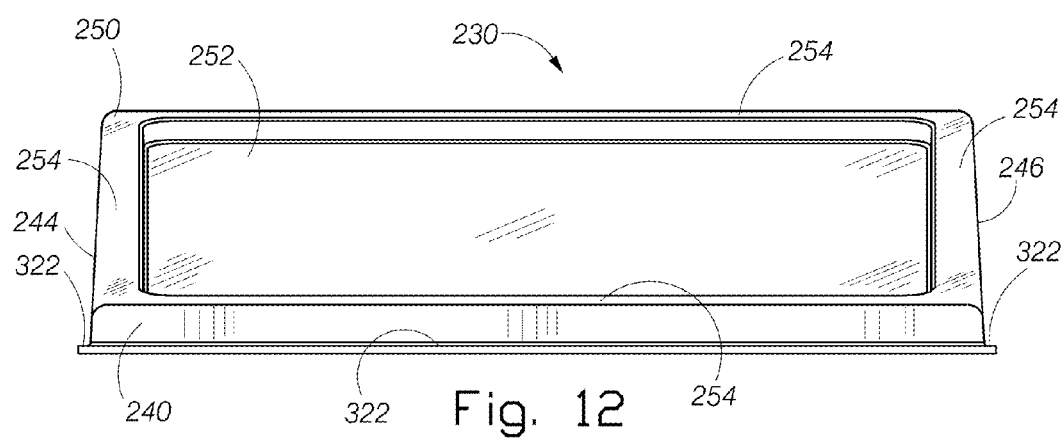
FIG. 12 illustrates a front elevational view of the upper shell portion of FIG. 9 showing the inclined recess that receives the portable electronic device of FIGS. 1-3.

As shown in the cross-sectional view of FIG. 5, the non-skid pad 280 fits snugly within a lower recess 300 in the lower base portion 202 of the support structure 200 with a portion of the non-skid pad extending downwardly from the lower base portion by approximately ⅛ inch. In the illustrated embodiment, the non-skid pad comprises urethane or other suitable compressible material so that when pressure is applied to the upper surface 122 of the support structure, the non-skid pad frictionally engages the upper surface 110 of the accessory desk 100 so that the support structure remains substantially fixed with respect to the upper surface of the accessory desk when lateral force is applied to the support structure. In contrast, the support structure is easily removed from the upper surface of the accessory desk by lifting the support structure vertically upward from the upper surface. In the illustrated embodiment, the non-skid pad has a substantially square shape with sides of approximately 13.9 inches and has a thickness of approximately ¼ inch. The lower recess of the lower base portion has a corresponding substantially square shape with inner perimeter edges that are slightly shorter than the sides of the non-skid pad so that the non-skid pad can be slightly compressed for insertion into the lower recess. The resilience of the non-skid pad forces the edges of the non-skid pad against the inner perimeter of the lower recess so that friction retains the non-skid pad within the lower recess until deliberately removed. In the illustrated embodiment, the lower recess has a depth of approximately ³⁄₁₆ inch so that the lower ¹⁄₁₆ inch of the non-skid pad extends below the lower base portion to assure that vertical pressure applied to the support structure causes the lower surface of the non-skid pad to engage the upper surface of the accessory desk.

The lower base portion 202 includes an upper extended portion 310 that extends upward from a ledge 312. In the illustrated embodiment, the ledge extends inwardly from outer edges 212, 214, 216, 218 of the lower base portion by approximately ¼ inch. The upper extended portion has a height of approximately ³⁄₁₆ inch and is drafted inwardly at a draft angle of approximately 3 degrees. The base of the upper extended portion is substantially square with outer edges 218 of the base at the intersections with the ledge having lengths of approximately 14.25 inches.

The upper shell portion 204 is formed in the general shape of a truncated four-sided pyramid with a generally square base 320 with four generally equal base edges 322 that extend outwardly approximately ³⁄₁₆ inch from the respective front, rear, left side and right side walls 240, 242, 244, 246. The four walls have thicknesses of approximately ⅛ inch so that the upper shell portion is hollow inside. Each of the four walls extends upward from a respective one of the edges at a draft angle of approximately 3 degrees. The lengths of the four edges of the square base are selected so that the inner dimensions of the four side walls at the base are substantially equal to the outer dimensions of the upper extended portion 310 of the base portion 210. Thus, the inner surfaces of the four walls of the upper shell portion form a recess 324. When the upper shell portion is positioned over the upper extended portion of the lower base portion, the recess of the upper shell portion fits over the upper extended portion of the lower base portion. The inner surfaces of the upper shell portion frictionally engage the outer surfaces of the extended upper portion of the lower base portion; and the base edges of the upper shell portion rest on the ledges 312 of the lower base portion as shown in the cross-sectional view in FIG. 5. Accordingly, the upper shell portion remains engaged with the lower base portion during normal use but can be disengaged from the lower base portion so that the elements of the support structure can be disassembled for cleaning.

As described above, the four inwardly tapering walls 240, 242, 244, 246 of the upper shell portion 230 support the upper surface 250. In the illustrated embodiment, the upper surface is not quite square because of the tapering walls and the differing heights of the front wall and the rear wall such that the upper surface is slightly wider nearer the front wall. The upper surface has a generally square positioning frame receiving recess 250 formed to a depth of approximately 0.385 inch. The recess has edges of approximately 12.75 inches and is drafted outwardly along the front and rear edges. A ledge 252 formed by the non-recessed portion of the upper surface surrounds the recess. In the illustrated embodiment, the upper surface has a material thickness of approximately ⅛ inch beneath the ledge and beneath the recess. In the illustrated embodiment, the upper shell portion comprises a suitable ABS plastic material and is formed by injection molding.

Figure 13:
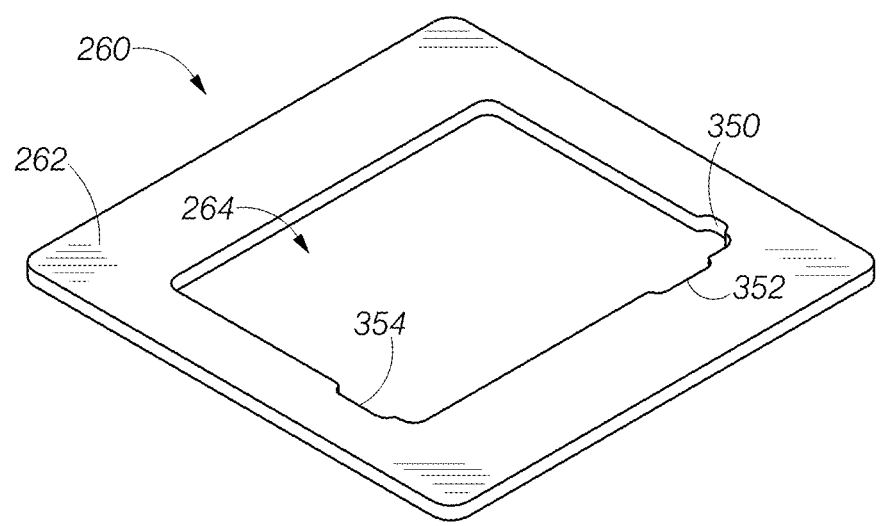
FIG. 13 illustrates the device positioning frame configured with a through device receiving opening for receiving and retaining a portable electronic device having a shape and dimensions corresponding to a tablet computer.
Figure 14:
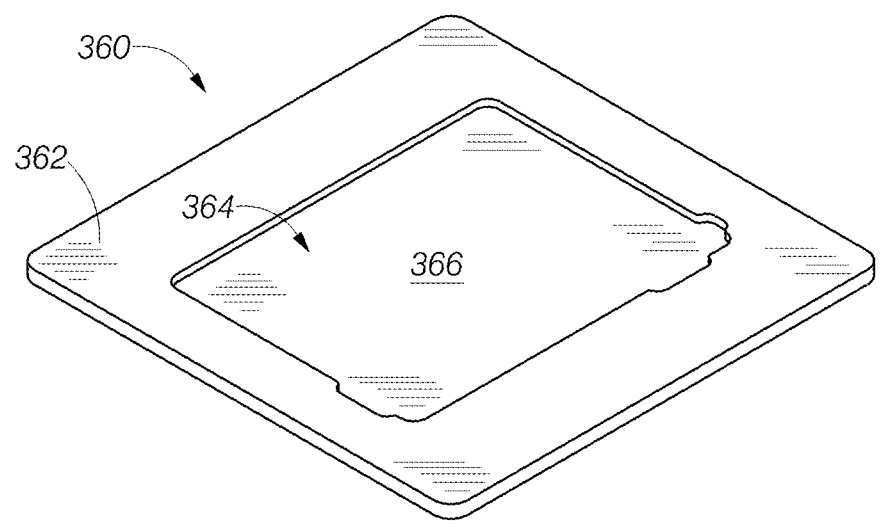
FIG. 14 illustrates an alternative embodiment of the device positioning frame of FIG. 13 wherein the device receiving opening is configured as a recess with a bottom surface to adjust the depth of the device receiving opening to accommodate a thinner portable electronic device.

The positioning frame receiving recess 250 in the upper surface 122 of the upper shell portion 204 is sized and shaped to receive the positioning frame 260, which is shown in more detail in FIGS. 13 and 14. The positioning frame is generally square and has outer edges with lengths selected to generally correspond to the lengths of the four sides of the recess so that the positioning frame fits snugly within the recess but is easily removed for rotation, as discussed below. In the illustrated embodiment, the positioning frame has sides of approximately 12.75 inches each. The positioning frame has a thickness of approximately ⅜ inch so that when the positioning frame is placed in the recess, the exposed upper surface of the positioning frame is almost flush with the ledge 252 surrounding the recess. In the illustrated embodiment, the positioning frame comprises urethane or another suitable material that can be removed from the recess and cleaned as needed. The square configuration of the positioning frame allows the positioning frame to be inserted into the frame positioning recess in four orthogonal configurations described below.

As described above, the positioning frame 260 includes the central device receiving opening 264 that extends through the positioning frame in the illustrated embodiment. In alternative embodiments (see FIG. 14), the central device receiving opening may be replaced by a recess to receive thinner portable electronic devices. Alternatively, the positioning frame may be thinner to accommodate a thinner portable electronic device while maintaining the upper surface of the portable electronic device substantially flush with the upper surface 262 of the positioning frame. In further alternative embodiments, a generally rectangular insert (see FIG. 15) may be positioned in the central device receiving opening to raise the portable electronic device within the opening to maintain the upper surfaces in a substantially flush relationship. In the illustrated embodiment, the device receiving opening is sized and shaped to receive the portable electronic device 270 as shown in FIGS. 1-3. For example, for an Apple iPad® tablet computer, the device receiving opening is generally rectangular and has a longer dimension of approximately 9.5 inches and a shorter dimension of approximately 7.3 inches. The length and width of the device receiving recess are selected to be substantially the same as the corresponding outer dimensions of the portable electronic device so that when the portable electronic device is inserted into the device receiving recess, the inner edges of the device receiving recess gently grip the sides of the portable electronic device. Thus, the portable electronic device does not move within the device receiving recess during normal use. The substantially flush upper surfaces of the positioning frame and the portable electronic device within the device receiving opening allow a user to easily move his or her hands from the upper surface of the portable electronic device to the upper surface of the positioning frame.

In the illustrated embodiment, the device receiving opening 264 of the positioning frame 260 includes a plurality of clearance notches that extend outwardly from the main cavity of the recess. The notches provide clearances to accommodate controls on the portable electronic device 270 so that the controls are not inadvertently activated when the portable electronic device is inserted into and removed from the device receiving opening. For example, for the positioning frame configured for the Apple iPad® tablet computer, a first clearance notch 350 is located on the top of the device receiving recess near the upper right corner of when viewed in the portrait mode in FIG. 2. The first clearance notch allows the tablet computer to be inserted into the device receiving recess without inadvertently activating the on/off switch (not shown) of the tablet computer. The first clearance notch also provides sufficient access to allow the on/off switch to be accessed while the portable electronic device is in the device receiving opening. A second clearance notch 352 is located on the right side of the device receiving opening near the upper right corner. The second clearance notch provides clearance and access for the mute, volume-up and volume down controls (not shown) of the tablet computer. A third clearance notch 354 is located near the right corner of the bottom of the device receiving opening. The third clearance notch provides clearance to allow sound emanating from the tablet computer to exit outward from the tablet computer and upward from the device receiving opening. An additional notch (not shown) may be included to allow access to the power/USB receptacle (not shown) of the tablet computer so that the tablet computer can be positioned in the recess with the power plug (not shown) inserted in the tablet computer. In the illustrated embodiment, the support structure 200 is intended to be used when the tablet computer is in the fully portable (no power connected) mode so that no electrical wiring is present in a potentially wet environment. It should be understood that the number and the positions of the clearance notches are varied in accordance with the table computer or other portable electronic device to be accommodated by the positioning frame.

As discussed above, the positioning frame 260 is insertable into the positioning frame receiving recess 252 in at least two orientations as shown in FIGS. 1 and 2. When the positioning frame is positioned as shown in FIG. 1, the central device receiving opening 264 is positioned with the longer dimension parallel to the front edge 212 of the base portion 210 of the support structure 200 such that the central device receiving opening 264 of the positioning frame receives the portable electronic device 270 in the landscape orientation. When the positioning frame is positioned as shown in FIG. 2, the central device receiving recess is positioned with the longer dimension perpendicular to the front edge of the base portion of the support structure such that the central device receiving opening of the positioning frame receives the portable electronic device in the portrait orientation. Accordingly, the person seated in the wheelchair can access the portable electronic device in either of the two major orientations of the portable electronic device. The positioning frame can also be inserted into the positioning frame receiving recess in two additional orthogonal configurations that allow the portable electronic device to be positioned in a left-to-right reversed landscape orientation and a top-to-bottom reversed portrait orientation.

In the illustrated embodiments, the device positioning frame 260 is sufficiently larger than the central device receiving opening such that the device positioning frame provides a perimeter surface surrounding the central device receiving opening onto which a person may rest his or her hands when not accessing the portable electronic device 270 within the central device receiving opening. Thus, the person may rest his or her hands near the portable electronic device without touching the screen until necessary to activate a function of the device. As discussed above, the substantially flush upper surface 262 of the positioning frame and the upper surface of portable electronic device within the device receiving opening 264 allow a user to easily move his or her hands from the upper surface of the portable electronic device to the upper surface of the positioning frame.

In FIG. 14 a modified positioning frame 360 with an upper surface 362 replaces the through central receiving opening 264 of FIG. 13 with a central receiving opening 364 that includes a bottom surface 366 such that the central receiving opening of FIG. 14 does not extend through the positioning frame. The depth of the central receiving opening of FIG. 14 is selected to accommodate and support a thinner portable electronic device (not shown) to cause the upper surface of the portable electronic device to be substantially flush with the upper surface of the modified positioning frame.

Figure 15:
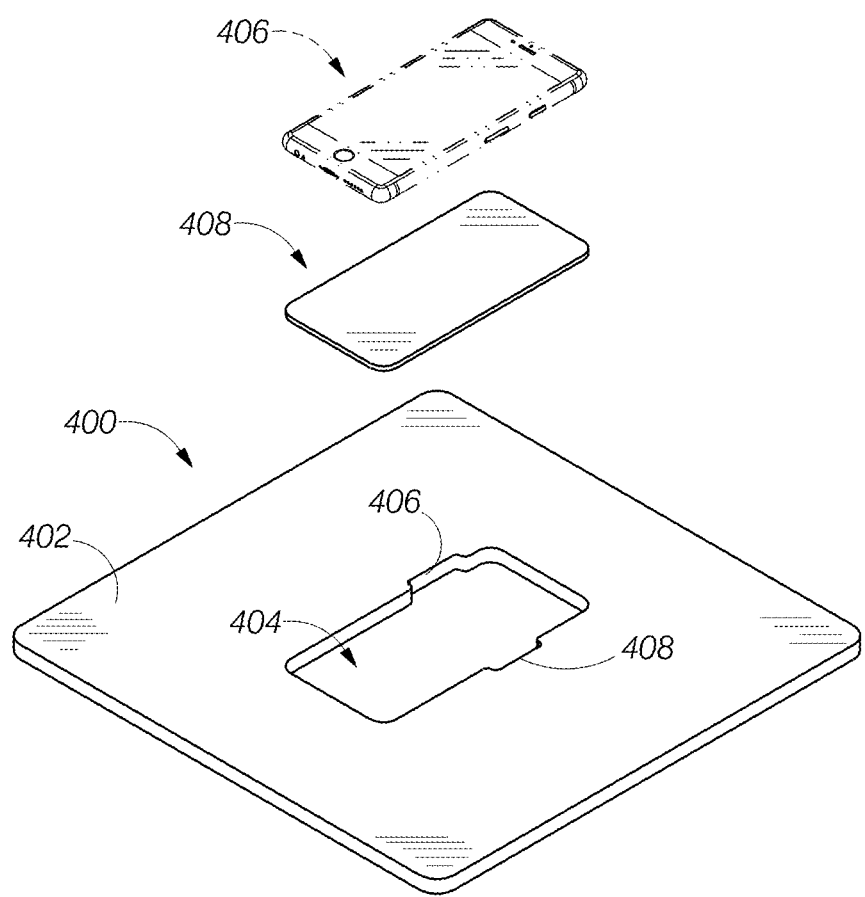
FIG. 15 illustrates a device positioning frame configured for receiving a portable electronic device having a shape and dimensions corresponding to a smartphone (shown in phantom) and also illustrates an optional insert which may be positioned beneath the portable electronic device to raise the device within the opening of the device receiving frame.
Figure 16:
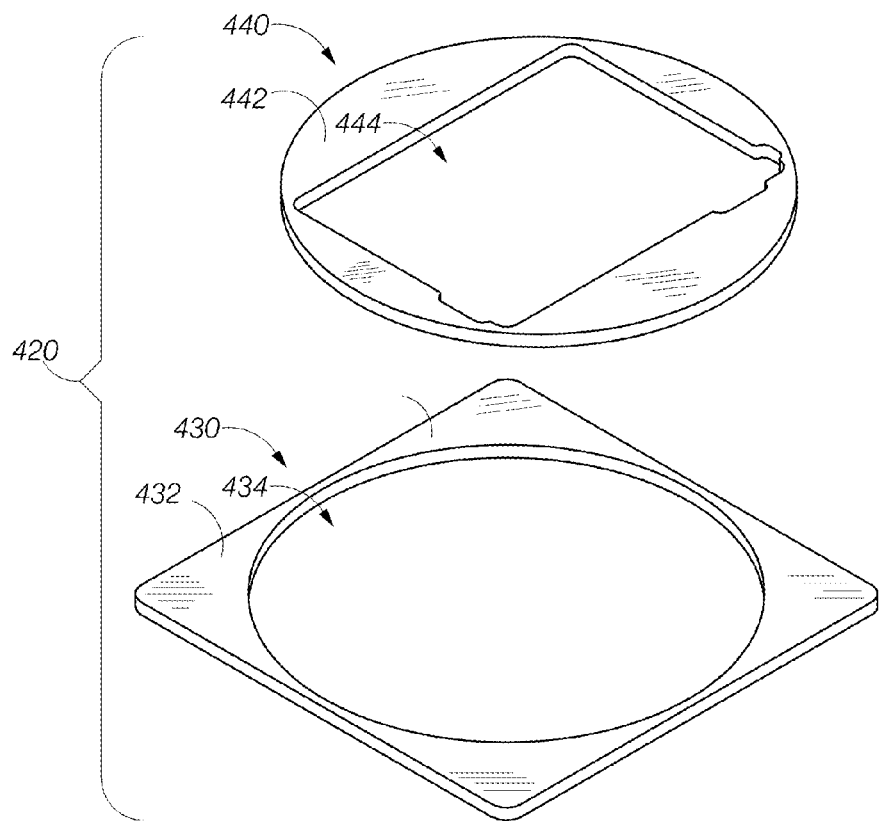
FIG. 16 illustrates an alternative embodiment of a two-piece device positioning frame having an outer generally square frame and a circular inner frame that is rotatable to multiple angular positions to allow the portable electronic device to be positioned at orientations in addition to the landscape and portrait orientations.

The support structure 200 is readily adaptable to a portable electronic device 270 having a different size and shape. FIG. 15 illustrates a modified positioning frame 400 that has a surface 402. A central device receiving opening 404 is formed through the modified positioning frame. For example, the central device receiving opening in FIG. 15 is configured to receive an Apple iPhone® mobile digital device 406 (shown in phantom) having a longer dimension of approximately 6.25 inches and a shorter dimension of approximately 3.1 inches. The central device receiving opening has a first clearance notch 406 and a second clearance notch 408 sized and located to provide clearance for controls on the sides of the mobile digital device. As described above, the modified positioning frame is positionable within the positioning frame receiving recess 252 to allow the mobile digital device to be positioned in any of the four orientations described above. As further described above, the central device receiving opening 404 may extend through the modified positioning frame as shown in FIG. 15. Alternatively, the central device receiving opening may only extend partially through the modified positioning frame (see FIG. 15) such that a thinner portable electronic device is supported by a bottom surface (not shown) of the central device receiving opening (or recess) with the respective upper surfaces of the positioning frame and the portable electronic device substantially flush with each other. In a further alternative, a generally rectangular insert 408 may be positioned in the central device receiving opening to cause the upper surfaces to be substantially flush.

Figure 17:
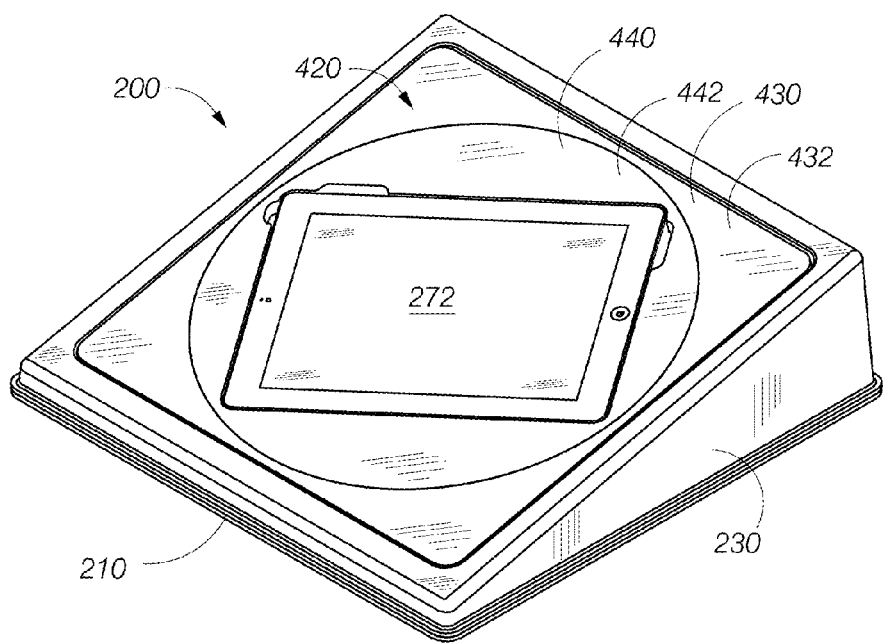
FIG. 17 illustrates the alternative embodiment of the two-device positioning frame of FIG. 16 inserted in the upper shell portion and with the portable electronic device inserted in the device positioning frame, the view showing the portable electronic device rotated to an orientation between the landscape orientation and the portrait orientation.

The frame positioning device can be modified to accommodate other orientations for portable electronic devices. For example, instead of providing for only four orientations as shown in the illustrated embodiment, additional orientations can be provided by replacing the positioning frame 260 with a modified two-piece positioning frame 420 illustrated in FIGS. 16 and 17. The modified two-piece positioning frame comprises an outer, generally square frame portion 430 that has outer dimensions corresponding to the outer dimensions of the previously described positioning frame. The outer frame portion has a surface 432. A central portion of the outer frame portion is removed to form a circular opening 434. In the illustrated embodiment, the circular opening has a diameter of approximately 12.25 inches. The modified two-piece positioning frame further comprises a circular inner frame portion 440 that is sized to fit within the circular opening of the outer frame portion. The inner frame portion has a surface 442. A central device receiving opening 444 is formed in the inner frame portion with dimensions corresponding to the selected portable electronic device to be supported and retained by the support structure 200. The inner frame portion is positionable within the outer frame portion at any selected angle. For example, as shown in FIG. 17, the inner frame portion is rotated counterclockwise with respect to the portrait orientation so that a user having limited arm mobility may access the portable electronic device 270 at a more comfortable angle. Other configurations may be used to provide multiple orientations. For example, the circular opening in the outer frame portion may be replaced with an octagonal opening and the circular inner frame portion may be replaced with a corresponding octagonal inner frame portion to provide a two-piece positioning frame with eight orientations.

Although the support structure 200 is described herein as being a generally square structure, one skilled in the art will appreciate that other shapes can be utilized to provide differing aesthetic appearances. As set forth above, the particular dimensions (lengths and angles) are provided herein as a description of one embodiment; however, other lengths and angles may also be used in other embodiments.

FIGS. 18-65 disclose another embodiment of a support structure 500, which includes additional features. The support structure 500 is similar to the previously described support structure 200; however, as described below, the support structure 500 allows the user to adjust the upper surface to a plurality of angles. The support structure 500 also includes features to retain the tablet computer (e.g., the table computer 272) more securely.

Figure 18:
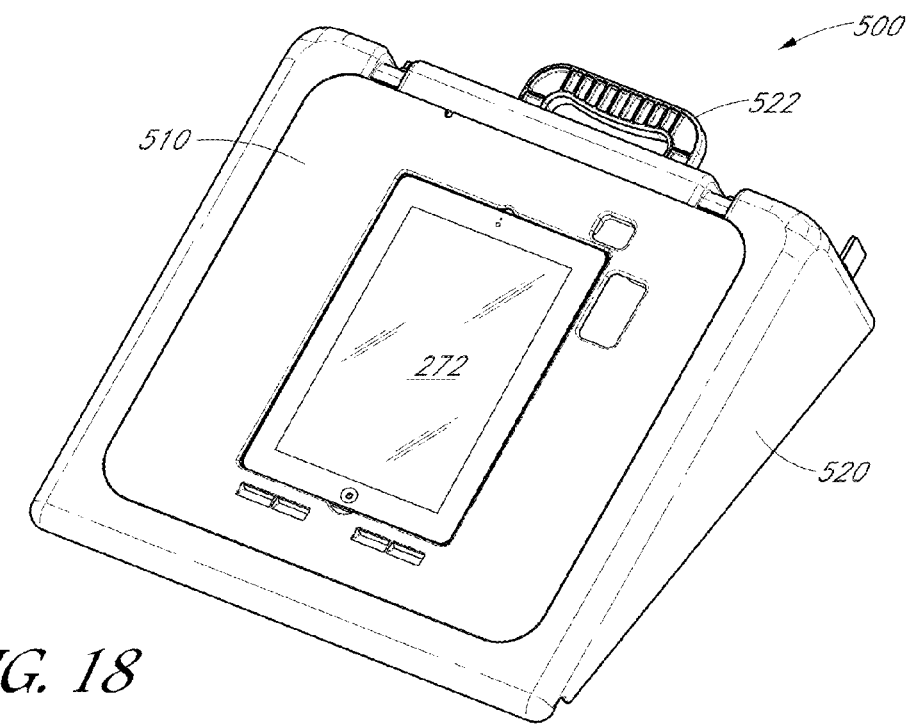
FIG. 18 illustrates a perspective view of an embodiment of a support structure for a portable electronic device (e.g., a tablet computer) that has an adjustable angular (elevational) position for the upper surface supporting the device, the support structure configured to retain the portable electronic device in a landscape orientation with respect to a user (not shown)
Figure 19:
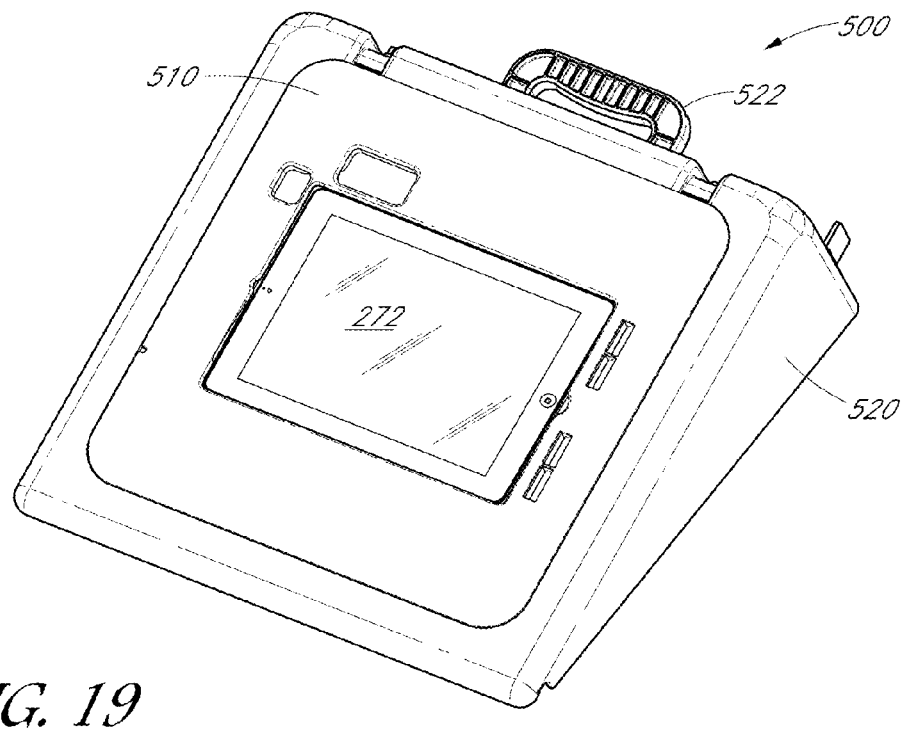
FIG. 19 illustrates a perspective view of the support structure of FIG. 18 with the support structure configured to retain the portable electronic device in a portrait configuration.
Figure 20:
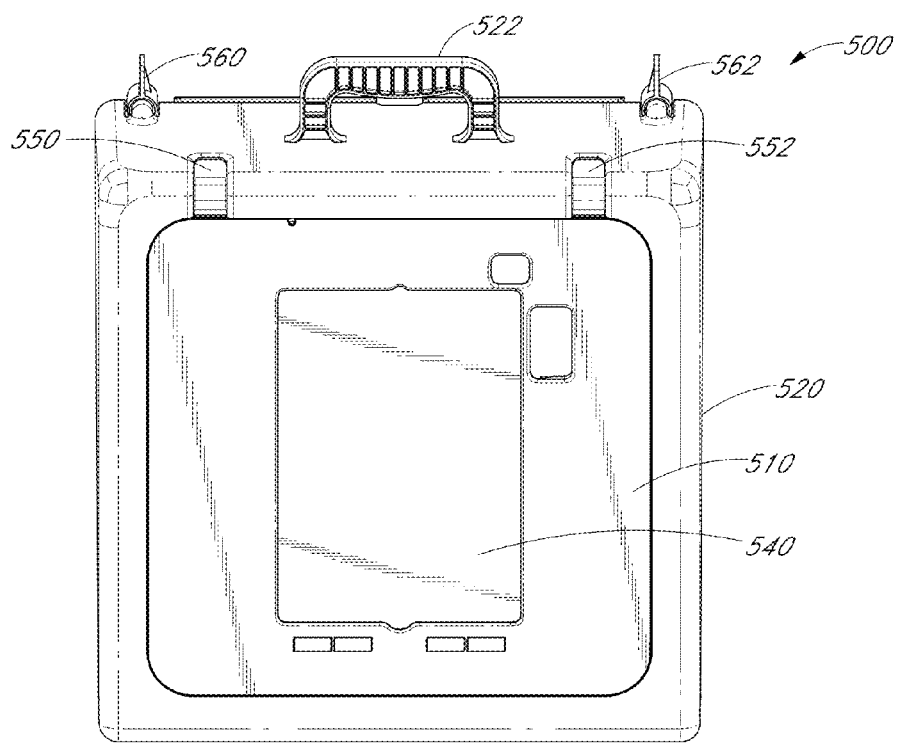
FIG. 20 illustrates a top plan view of the support structure of FIG. 18 without the portable electronic device.
Figure 21:
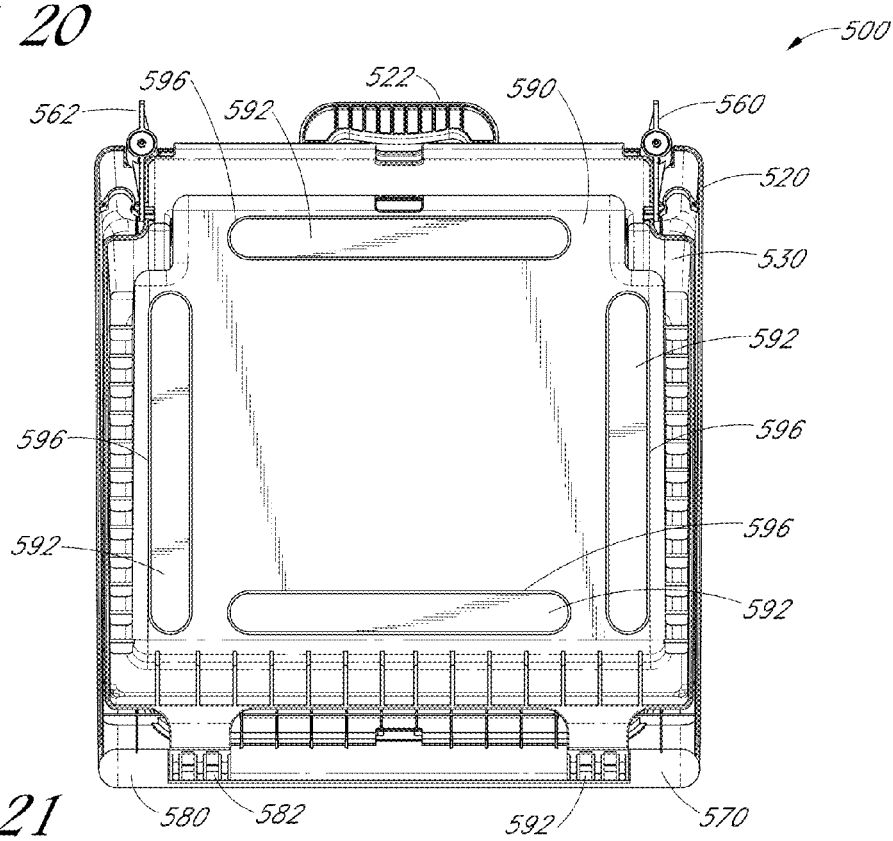
FIG. 21 illustrates a bottom plan view of the support structure of FIG. 18.
Figure 22:
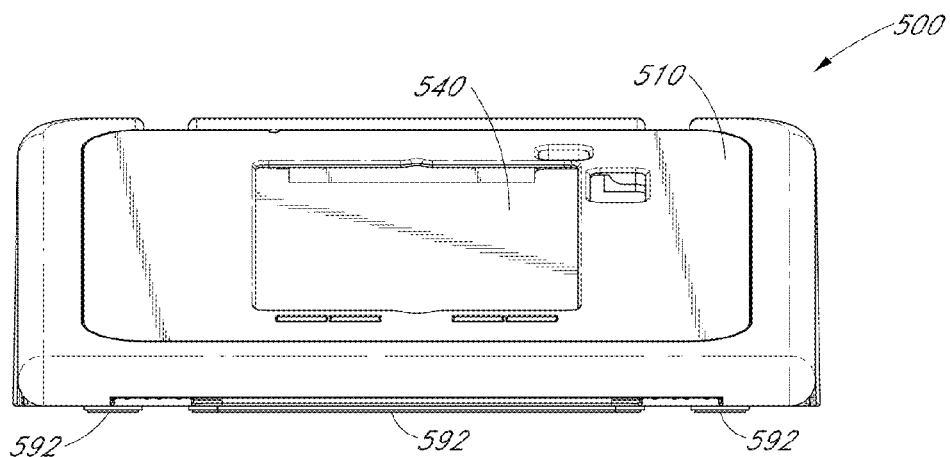
FIG. 22 illustrates a front elevational view of the support structure of FIG. 18.

The support structure 500 is shown in a perspective view in FIG. 18 with a faceplate 510 positioned in an outer shell 520 in an orientation to secure an electronic device (e.g., a tablet computer 272) in a portrait orientation. The faceplate 510 generally corresponds to the previously described positioning frame (positioning structure) 260 but with modifications, which are described below. One aspect of the modifications (described below) is that the electronic device is secured to the support structure using a latching mechanism that must be disengaged to allow the electronic device to be removed from the support structure. In FIG. 19, the faceplate 510 is shown in an orthogonal orientation to receive the tablet computer in a landscape orientation. As described below, the faceplate is easily adjusted between the two orientations. In FIGS. 20-61, the support structure 500 is illustrated in various views without the tablet computer or other electronic device. Where shown in the figures, the faceplate 510 is shown in the perspective orientation of FIG. 18; however, it should be understood from the following description that neither orientation is preferable over the other orientation.

The outer shell 520 has a carrying handle 522. The handle can be molded as part of the same structure as the outer shell (e.g., by injection molding ABS plastic), or the handle can be constructed separately and attached to the outer shell in a conventional manner. The handle allows the support structure to be easily transported. As described below, the faceplate 510 secures the tablet computer 272 to the support structure so that the support structure can be transported by the handle with the tablet computer mounted in the support structure.

Figure 25:
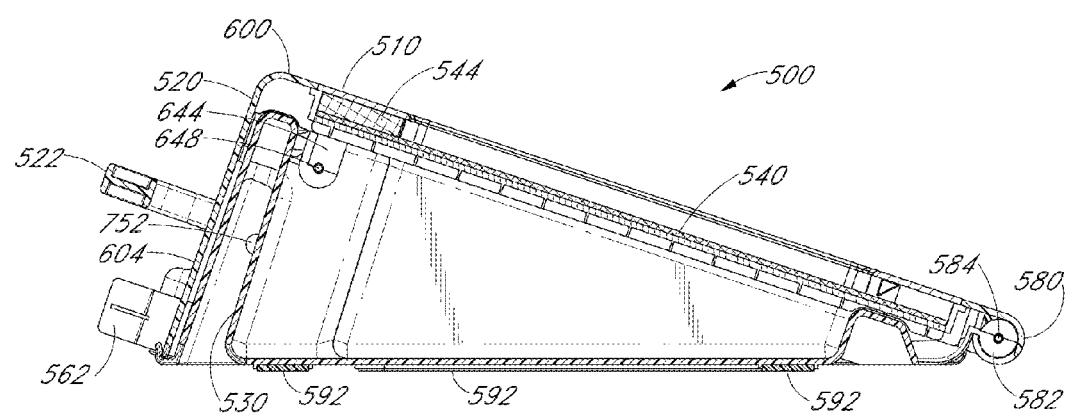
FIG. 25 illustrates a cross-sectional elevational view of the support structure of FIG. 18 taken along the line 25-25 in FIG. 23.

As shown in FIG. 25, the support structure includes the outer shell 520 and the faceplate 510. The support structure further includes an inner shell 530, a lower planar support pad 540, an upper left support pad 542 and an upper right support pad 544. The support structure further includes a left faceplate latch 550 and a right faceplate latch 552. The support structure further includes a left elevation latch 560 and a right elevation latch 562. As described below, the front (distal) portion of the outer shell is pivotally coupled to the front portion of the inner shell by a left hinge structure comprising a left outer shell hinge half 570, a left inner shell hinge half 572 and a left hinge pin 574. The outer shell is further pivotally coupled to the inner shell by a right hinge structure comprising a right outer shell hinge half 580, a right inner shell hinge half 582 and a right hinge pin 584. The inner shell has a generally planar (flat) bottom surface 590 that supports a plurality (e.g., 4) of silicone non-skid pads 592 within a corresponding plurality of positioning recesses 594 defined by oval-shaped wall structures protruding from the bottom surface. The recesses are positioned parallel to the distal, proximal, left and right edges of the bottom surface as shown. The pads are secured within the recesses using an adhesive (e.g., glue) in a conventional manner. In one embodiment, the outer dimensions of the non-skid pads have lengths of approximately 221 millimeters and widths of approximately 12.5 millimeters and have rounded ends as shown. The wall structures defining the recesses have corresponding inner dimensions. In the illustrated embodiments, each non-skid pad has a thicknesses of approximately 3 millimeters, and each recess has a depth of approximately 2 millimeters such that approximately 1 millimeter of each pad extends below the wall of the respective recess.

The outer shell 520 is shown in more detail in FIGS. 28-36. The outer shell includes a sloped top surface 600, a front (proximal) wall 602, a rear (distal) wall 604, a left wall 606 and a right wall 608. As shown in the bottom views in FIGS. 29 and 32, the front wall, the rear wall, the left wall and the right wall surround a lower cavity 610 that extends to a lower side 612 of the top surface. The lower side of the top surface includes a plurality of crossing ribs 614 that provide support to the top surface without adding substantial mass.

Figure 24:
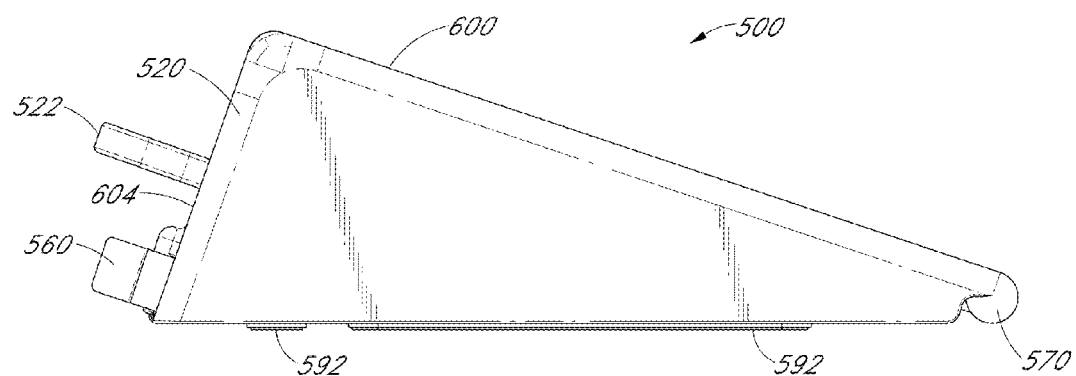
FIG. 24 illustrates a left side elevational view of the support structure of FIG. 18.

The shape of the outer shell 520 is similar to the shape of the outer shell of the previously described embodiment. In the illustrated embodiment, the outer shell has a width defined by the lower edges of the left wall 606 and the right wall 608 that tapers from approximately 397 millimeters at the rear wall 604 to approximately 393 millimeters at the front wall 602. The outer shell has a length (not including the handle 522) of approximately 419 millimeters. When the outer shell is in the lowermost elevation position with respect to the inner shell 530 as shown in FIG. 24, the top surface slopes upward from the front wall to the rear wall at an angle of approximately 18.5 degrees with respect to horizontal. In the illustrated embodiment, the top surface 600 is generally flat and is approximately 368 millimeters wide by approximately 368 millimeters long. When the outer shell is in the position shown in FIG. 24, the rear wall slopes toward the front of the support structure at an angle of approximately 19.5 degrees with respect to vertical.

The top surface 600 of the outer shell 520 includes a generally square recessed upper cavity 620 that is sized and shaped to receive the faceplate 510. In the illustrated embodiment, the upper cavity is generally square and has sides of approximately 323 millimeters. The upper cavity has a main depth of approximately 15 millimeters. The upper cavity is surrounded by an outer ledge 622 that has a width of approximately 3 millimeters and has a depth with respect to the top surface of approximately 3 millimeters. Thus, the upper cavity has an overall depth of approximately 18 millimeters. As described below, the outer ledge receives and supports the faceplate 510.

Figure 29:
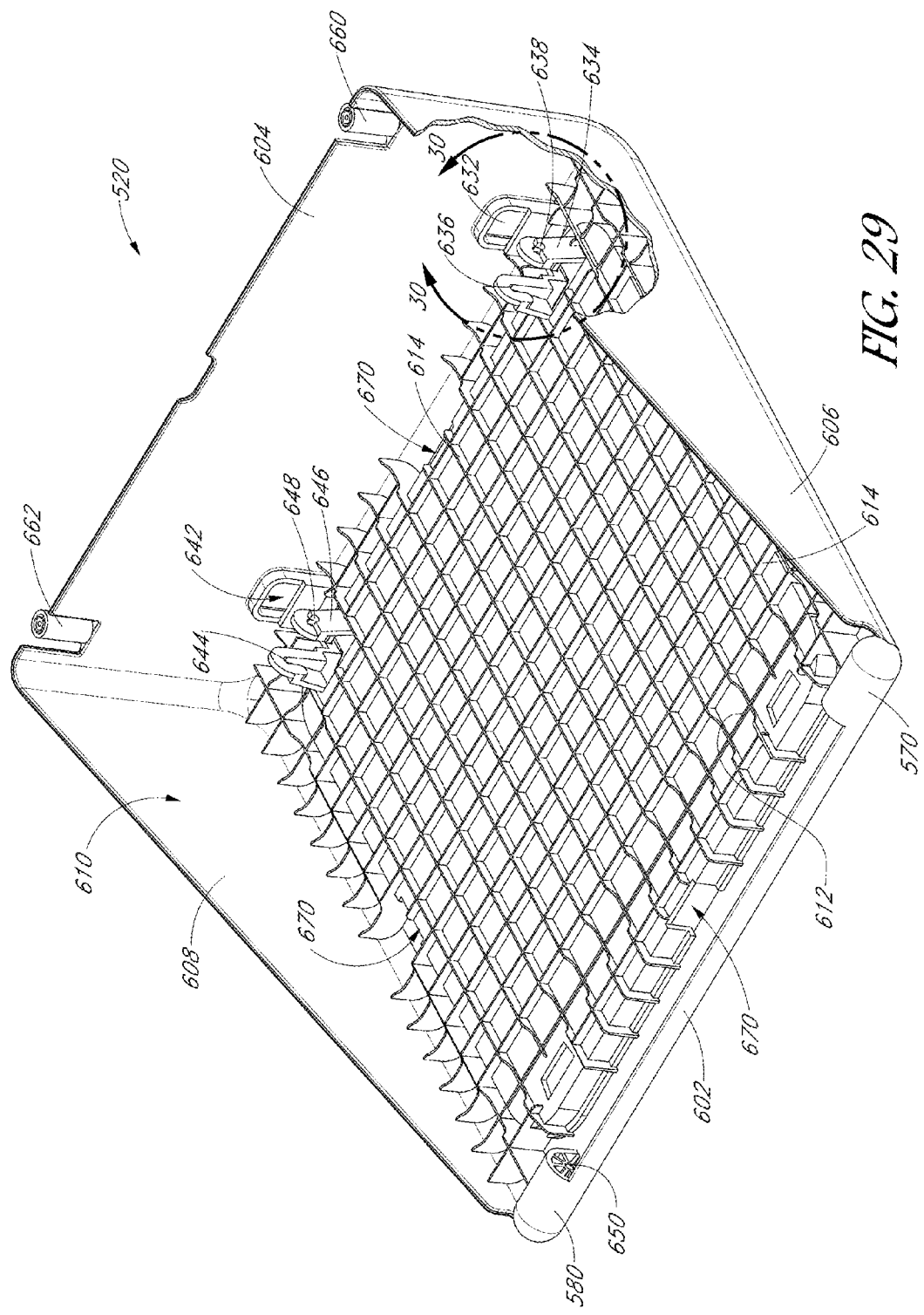
FIG. 29 illustrates a lower left front perspective view of the outer shell of FIG. 27.
Figure 30:
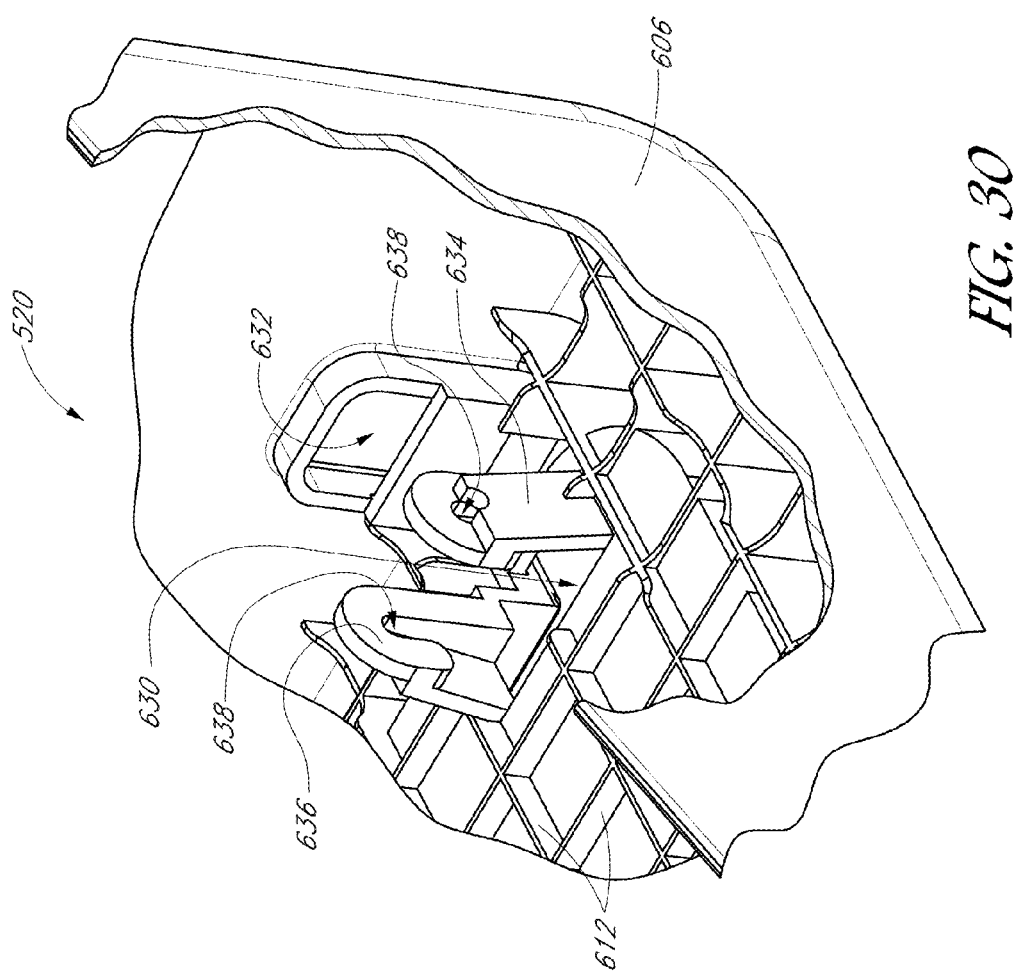
FIG. 30 illustrates an enlarged perspective view of a portion of the outer shell taken within the area—30—in FIG. 29.
Figure 37:
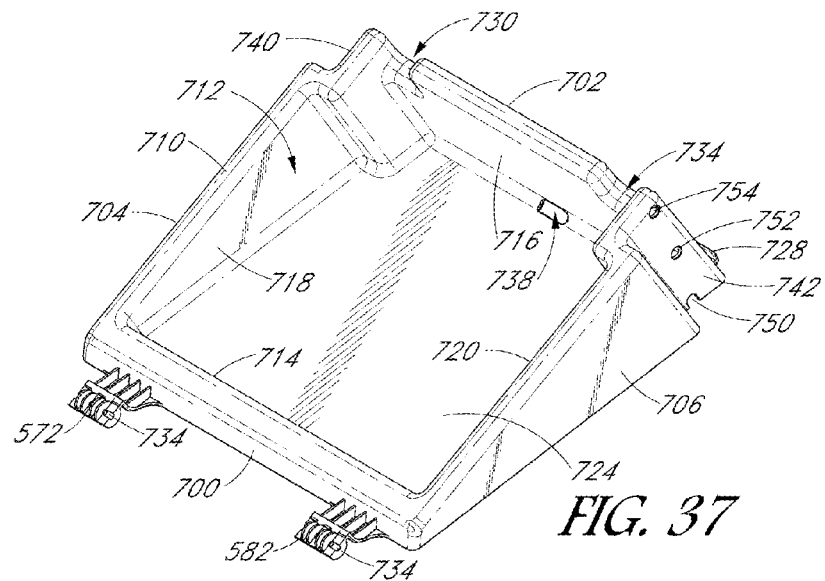
FIG. 37 illustrates a top right front perspective view of the inner shell of the support structure of FIGS. 18-26.
Figure 38:
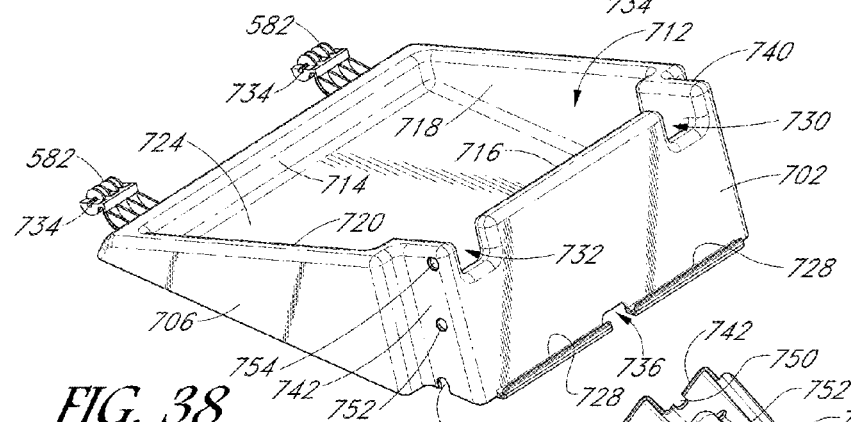
FIG. 38 illustrates a top right rear perspective view of the inner shell of FIG. 37.
Figure 39:
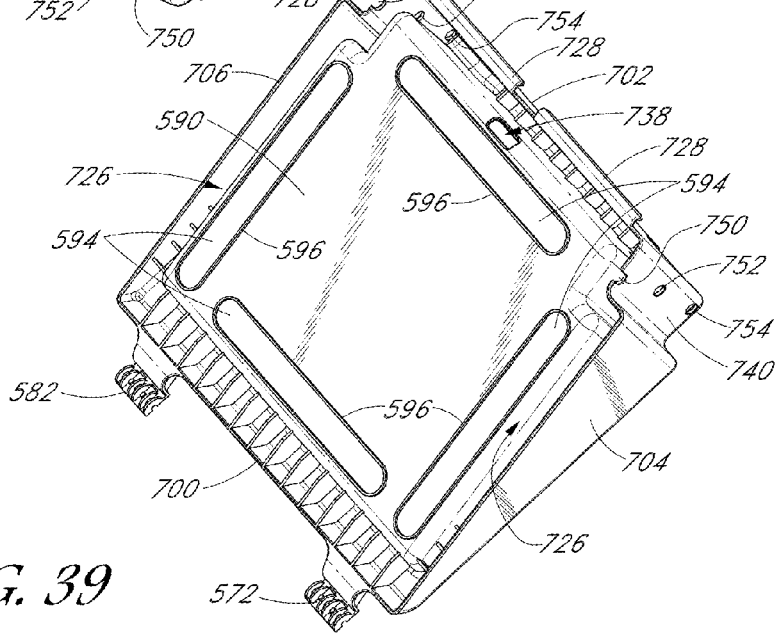
FIG. 39 illustrates a bottom left perspective view of the inner shell of FIG. 37.

The proximal portion of the upper cavity 620 of the outer shell 520 includes a left engagement bracket 624 and a right engagement bracket 626 that engage the faceplate in a manner described below. The distal portion of the upper cavity includes a first left faceplate latch opening 630. The distal wall 604 of the outer shell includes a second left faceplate latch opening 632. The two left faceplate latch openings accommodate portions of the left faceplate latch 550 as described below. As shown in FIGS. 29 and 30, the first and second left faceplate latch openings are proximate to a first left support pier 634 and a second left support pier 636. The support piers extend downward away from the lower side 612 of the top surface 600. Each left support pier has a respective bore 638 therethrough The distal portion of the upper cavity 620 includes a first right faceplate latch opening 640. The distal wall 604 of the outer shell 520 includes a second right faceplate latch opening 642. The two right faceplate latch openings accommodate portions of the right faceplate latch 552. The two right faceplate latch openings are proximate to a first right support pier 644 and second right support pier 646. The two right support piers also extend downward away from the lower side of the top surface. Each right support pier has a respective bore 648 therethrough. As described below, each bore receives an end of a faceplate latch pivot.

The outer shell 520 further includes the left outer shell hinge half 570 and the right outer shell hinge half 580. As shown for the right outer shell hinge half, each hinge half includes a bore 650 that receives the respective hinge pin 574, 576 of FIG. 25.

Figure 28:
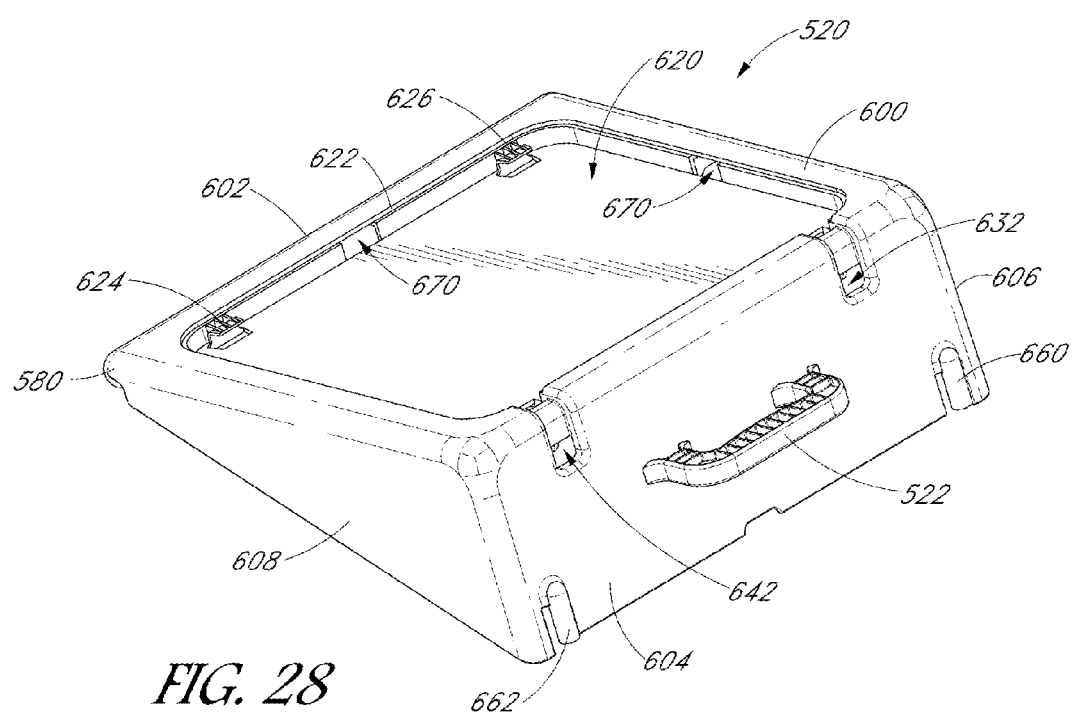
FIG. 28 illustrates an upper right rear perspective view of the outer shell of FIG. 27.

As shown in FIG. 28, for example, the outer shell 520 further includes a left pivot support 660 for the left elevation latch 560 and a right pivot support 662 for the right elevation latch 562.

In the illustrated embodiment, the outer shell 520 further includes a plurality of openings 670 along each edge of the upper cavity 620 that extend through to the lower cavity 610. The four openings allow a power cable (not shown) to be routed from the lower cavity to the upper cavity to provide power to the electronic device 272 (FIGS. 18 and 19) when the electronic device is oriented in any of the four orientations.

The inner shell 530 is shown in more detail in FIGS. 37-45. The inner shell includes a front (proximal) outer wall 702, a rear (distal) outer wall 704, a left outer wall 706 and a right outer wall 706. The inner shell has a relatively narrow upper surface 710 that surrounds an upper cavity 712. The upper cavity of the inner shell is defined by inner walls 714, 716, 718, 720, which are spaced apart from the respective outer walls by a lower cavity 722 positioned beneath the upper surface. The lower cavity has a cavity floor 724 defined between the four inner walls. Additional support for the upper surface is provided by a plurality of ribs 726. As shown in FIG. 31, the lower edge of the distal wall includes a pair of grooves 728 that receive the lower edge of the distal wall 604 of the outer shell 520 when the outer shell is in the lowermost elevational position.

The inner shell 530 has a shape similar to the shape of the outer shell 520 except that the dimensions are smaller so that the inner shell nests within the outer shell. For example, in the illustrated embodiment, the inner shell has a width that tapers from approximately 386 millimeters at the lower edge of the rear wall 702 to approximately 383 millimeters at the lower edge of the front wall 700. The inner shell has a length of approximately 359 millimeters from the lower edge of the rear wall to the lower edge of the front wall, not including the left inner shell hinge half 572 and the right inner shell hinge half 582, which add approximately 48 millimeters to the overall length of the inner shell. As described below, the outer shell is able to rotate about the left inner shell hinge half and the right inner shell hinge half to adjust the elevational angle of the outer shell with respect to the inner shell.

The distal (rear) wall 702 of the inner shell 530 includes an upper left notch 730 and an upper right notch 732 that extend from the distal wall into the upper cavity 712. The notches provide clearance for the left faceplate retainer latch 550 and the right faceplate retainer latch 552 when the outer shell 520 is at its lowermost position with respect to the inner shell, as described below.

The inner shell 530 further includes an opening 736 on the rear wall 702 between the two grooves 728. The opening on the rear wall is aligned with an opening 738 that extends into the upper cavity 712 of the inner shell. The two openings allow a power cable (not shown) to be routed into the upper cavity of the inner shell. The power cable can then be routed through one of the openings 670 into the upper cavity 620 of the outer shell 520.

The left inner shell hinge half 572 and the right inner shell hinge half 582 extend from the proximal (front) 700 of the inner shell 530. Each inner shell hinge half has a respective bore 734 that receives the respective hinge pin 574, 584 when the inner shell is coupled to the outer shell 520. In the illustrated embodiment, the hinges are constructed with ribs to provide additional strength.

The left wall 704 includes a left indented portion 740 near the distal wall 702. The left indented portion provides clearance for the left elevation latch 560. Similarly, as shown in FIGS. 30 and 31, the right wall 706 includes a right indented portion 742 near the distal wall. The right indented portion provides clearance for the right elevation latch 562. Each of the indented portions includes a plurality of elevation control bores. A first elevation control bore 750 has the form of a semicircle near the lower end of the respective indented portion. A second elevation control bore 752 is circular and is positioned approximately midway up the indented portion toward the upper end of the respective indented portion. A third elevation control bore 754 is positioned near the upper end of the respective indented portion. Each of the first, second and third elevation control bores on the indented portions is positioned on a respective radial line extending from the centerline of the respective hinge bore 734 of the left inner shell hinge half 572 and the right inner shell hinge half 582. The radial lines are of substantially equal length such that the centers of the elevation control bores are approximately 363 millimeters from the centerline of the hinge bores. The center of the second elevation control bore is rotated approximately 8.63 degrees from the center of the first elevation control bore. The center of the third elevation control bore is rotated approximately 8.63 degrees from the center of the first elevation control bore. In the illustrated embodiment, the center of the first elevation control bore is rotated approximately 1.06 degrees below a horizontal plane that includes the centerline of the hinge bores. In the illustrated embodiment, each of the three bores has a diameter of approximately 11 millimeters.

The outer shell 520 is mounted to the inner shell 530 by positioning the left outer shell hinge half 570 adjacent the left inner shell hinge half 572 and by positioning the right outer shell hinge half 580 adjacent the right inner shell hinge half 582. The hinge bores 734 of the inner shell hinge halves are aligned with the bores 648 of the outer shell hinge halves. The left hinge pin 574 is inserted into the bores of the aligned left hinge halves. The right hinge pin 584 is inserted into the bores of the aligned right hinge halves. In the illustrated embodiment, the bores for the outer shell hinge halves have diameters substantially equal to (or slightly smaller than) the outer diameters of the hinge pins such that the hinge pins are pressed into the bores for the outer shell hinge halves and are tightly secured therein. In contrast, the diameters the bores of the inner shell hinge halves are larger than the outer diameters of the hinge pins. Thus, the hinge pins rotate freely within the inner shell hinge halves. For example, in one embodiment, the diameters of the bores of the outer shell hinge halves and the diameters of the hinge pins are approximately 4 millimeters, and the diameters of the bores of the inner shell hinge halves are approximately 4.8 millimeters.

Figure 23:
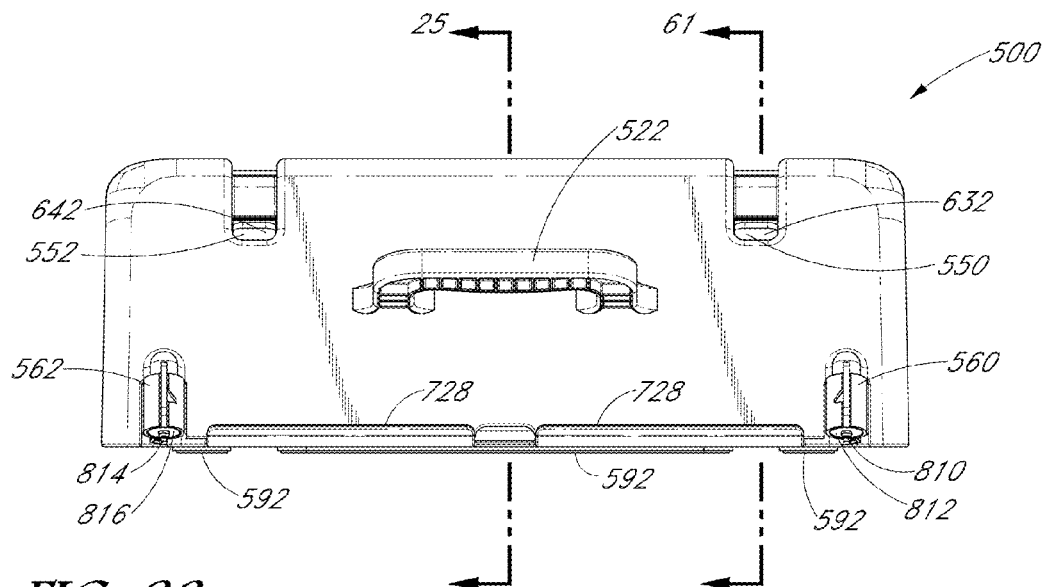
FIG. 23 illustrates a rear elevational view of the support structure of FIG. 18.
Figure 46:
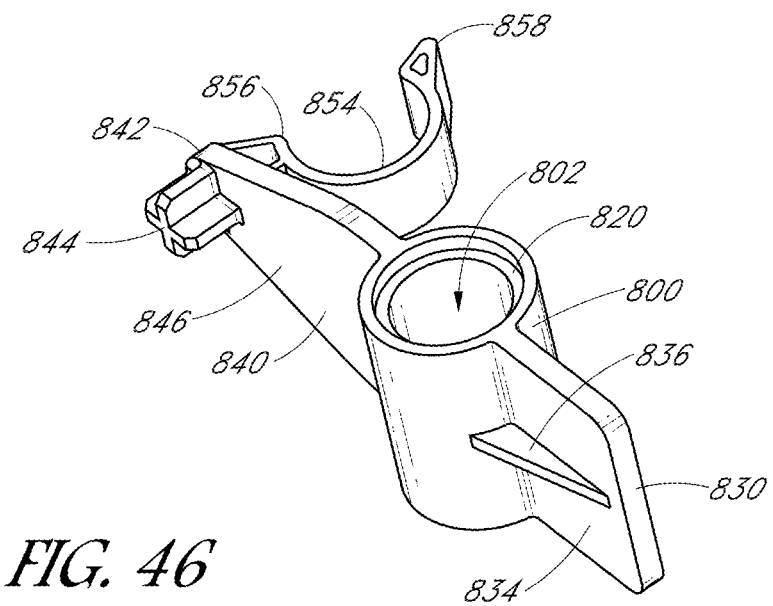
FIG. 46 illustrates a top perspective view of the left elevation latch of FIG. 26, the right elevation latch (not shown) being a mirror image of the left elevation latch.
Figure 47:
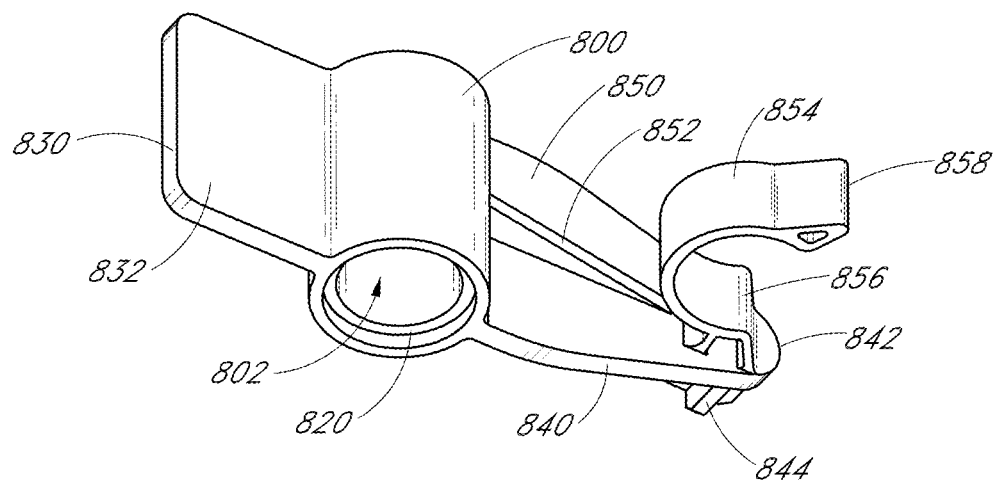
FIG. 47 illustrates a bottom perspective view of the elevation latch of FIG. 46.

FIGS. 46 and 47 illustrate a top perspective view and a bottom perspective view, respectively, of the left elevation latch 560. The right elevation latch 562 is substantially identical to the left elevation latch. The elevation latch comprises a cylindrical portion 800 that surrounds a cylindrical bore 802. The inner diameter of the cylindrical bore is sized and shaped to be slightly smaller than the outer diameter of the left pivot support 660 (FIGS. 28 and 29) on the distal wall 604 of the outer shell. For example, in an illustrated embodiment, the inner diameter of the bore is slightly greater than 14 millimeters and the outer diameter of the right pivot support is 14 millimeters (or slightly smaller). As shown in FIG. 23, the left elevation latch is secured to the left pivot support by a self-tapping screw 810 that passes through a flat washer 812. Similarly, the right elevation latch is secured to the right pivot support 662 by a self-tapping screw 814 that passed through a flat washer 816. In the illustrated embodiment, the elevation latch includes a recess 820 around each end of the cylindrical bore. The recess has an outside diameter (e.g., approximately 17 millimeters) that is slightly larger than the outside diameter of the flat washer (e.g., approximately 16 millimeters) so that the flat washer fits within the recess. The recesses at each end of the cylinder are symmetrical such that the left elevation latch and the right elevation latch are interchangeable.

The left elevation latch 560 further includes an engagement tab 830, which extends distally from the cylindrical portion 800 when the elevation latch is installed on the left pivot support 660 as shown in FIG. 23. A first side 832 of the engagement tab is smooth to receive a person's finger when operated to adjust the elevation of the outer shell 520 as described below. A second side 834 of the engagement tab includes a rib 836 that provides rigidity for the tab with respect to the cylindrical portion. A positioning arm 840 extends proximally from the cylindrical portion and tapers to a proximal end 842. An engagement protrusion 844 extends from a first side 846 of the positioning arm near the proximal end. The engagement protrusion could be a cylindrical protrusion; however, in the illustrated embodiment, the engagement is molded as an X-shaped or cross-shaped protrusion. The protrusion has an effective diameter at the positioning arm of approximately 10 millimeters. In the illustrated embodiment, the protrusion tapers to an effective diameter at a distal end (away from the positioning arm) of approximately 9 millimeters and then is chamfered as shown in FIG. 35. The protrusion is sized to fit within the elevation control bores 750, 752, 754 on the left indented portion 740 of the inner shell 530. In like manner, a corresponding engagement protrusion 844 on the right elevation latch 562 is sized to fit within the elevation control bores 750, 752, 754 on the right indented portion 742.

The length of the positioning arm 840 and the position of the protrusion 844 on the positioning arm are selected such that when the cylindrical portion 800 of the left elevation latch 560 is positioned on the left pivot support 660 with the positioning arm directed toward the front of the outer shell 520, the protrusion is spaced apart from the centerline of left hinge pin 574 by substantially the same radial distance as the centers of the elevation control bores 750, 752, 754 on the left indented portion 740 of the inner shell 530. The corresponding protrusion 844 on the right outer shell positioning latch 562 is positioned in like manner with respect to the elevation control bores 750, 752, 754 on the right indented portion 742 of the inner shell. Accordingly, as the outer shell is pivoted about the common centerline of the left hinge pin and the right hinge pin 582, the protrusions on the two outer shell positioning latches are aligned with the respective first elevation control bore 750 when the outer shell is at a first (lowest) elevational position with respect to the inner shell, are aligned with the respective second outer bore 752 when the outer shell is at a second (middle) elevational position, and are aligned with the respective third outer bore 754 when the outer shell is at a third (highest) elevational position. Each elevational position corresponds to a respective angular position of the outer shell with respect to the inner shell, which rests on a support (e.g., the table or desk 100 shown in FIGS. 1 and 2). The three elevational (angular) positions are described in more detail below.)

A second side 850 of the positioning arm 840 supports a rib 852 that provides rigidity for the positioning arm. A C-spring 854 extends from the second side of the positioning arm near the proximal end 842. As illustrated, a first end 856 of the C-spring is secured to the second side of the positioning arm, and a second end 858 of the C-spring is free (not connected). The C-spring operates similarly to a leaf spring. When pressure is applied to the second end of the C-spring to move the second end toward the first end, the resilience of the C-spring causes the second end to return to the original position when the pressure is released.

Figure 48:
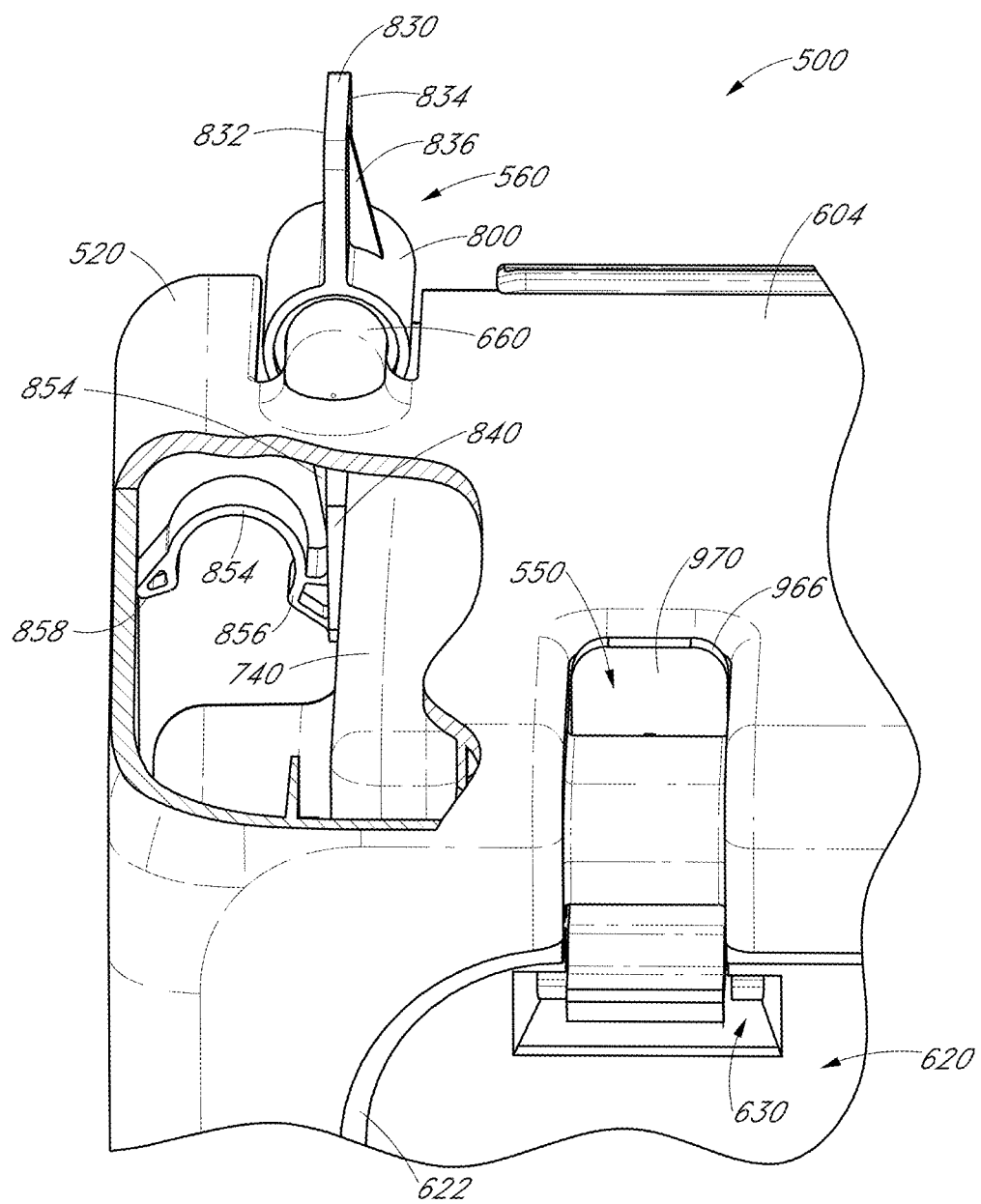
FIG. 48 illustrates a top plan view of the distal left corner of the support structure of FIGS. 18-26 taken within the area—48—in FIG. 20.

As shown in FIG. 48, when the left elevation latch 560 is positioned on the left pivot support 650, the free second end 858 of the C-spring 854 is positioned against the inner surface of the left wall 606 of the outer shell 520. The C-spring is either uncompressed or is lightly compressed. The protrusion 844 is engaged within the lowermost bore 750 of the left indented portion 740 of the inner shell 530 and cannot be seen in FIG. 48. When the left elevation latch is operated by pushing against the first side 832 of the engagement tab 830, the elevation latch pivots clockwise, which causes the positioning arm 840 to move to the left and to compress the C-spring. This allows the protrusion to disengage from the bore. A similar action with respect to the right elevation latch 562 pivots the corresponding positioning arm counterclockwise to disengage the respective protrusion. When both protrusions are disengaged, the outer shell can be pivoted with respect to the inner shell to adjust the angle of the top surface 600 of the outer shell.

The three elevational (angular) positions of the outer shell 520 with respect to the inner shell 530 are shown in FIGS. 49-54. In FIG. 49, the outer shell is in the lowermost angular position. As shown in the cross-sectional view of FIG. 50, the protrusion 844 of the right elevation latch 562 is engaged with the lowermost bore 750 of the right indented portion 742 to retain the outer shell in the lowermost angular position.

In FIG. 51, the outer shell 520 is in the middle angular position. As shown in the cross-sectional view of FIG. 52, the protrusion 844 of the right elevation latch 562 is engaged with the middle bore 752 of the right indented portion 742 to retain the outer shell in the middle angular position.

In FIG. 53, the outer shell 520 is in the uppermost angular position. As shown in the cross-sectional view of FIG. 54, the protrusion 844 of the right elevation latch 562 is engaged with the upper bore 754 of the right indented portion 742 to retain the outer shell in the uppermost angular position.

In each of the angular (elevational) positions illustrated in FIGS. 49-54, the corresponding protrusion 844 on the left elevation latch 560 is engaged in the respective bores 750, 752, 754 of the left intended portion 740 of the inner shell 530.

The outer shell 520 may also be rotated beyond the uppermost angular position so that the upper cavity 712 of the inner shell 530 is exposed. When the upper cavity of the inner shell is exposed, cables (e.g., a power cable and a headphone cables) may be inserted through the openings in the inner shell and the outer shell for connection to the electronic device 272.

Figure 26:
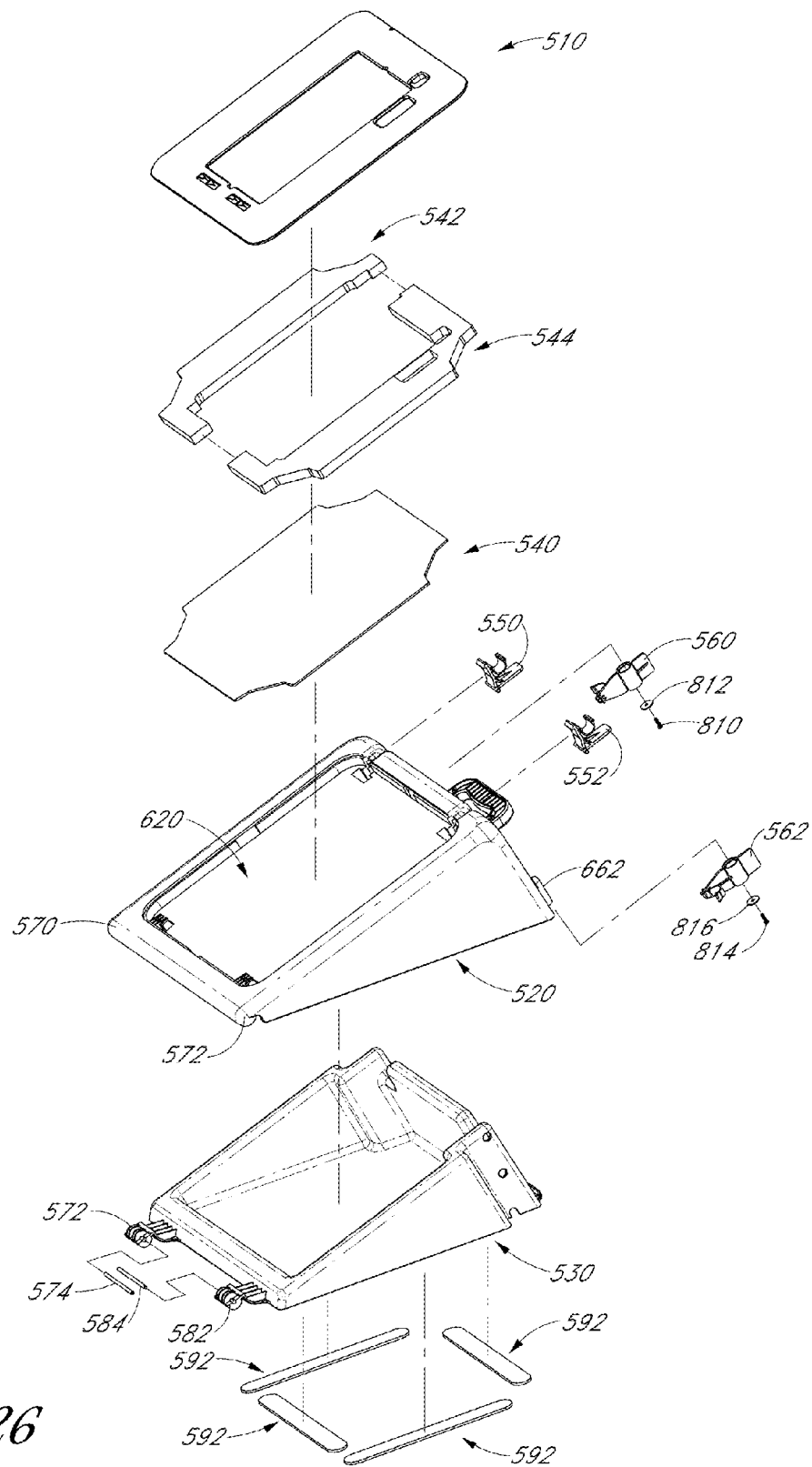
FIG. 26 illustrates an exploded perspective view of the support structure of FIG. 18.
Figure 27:
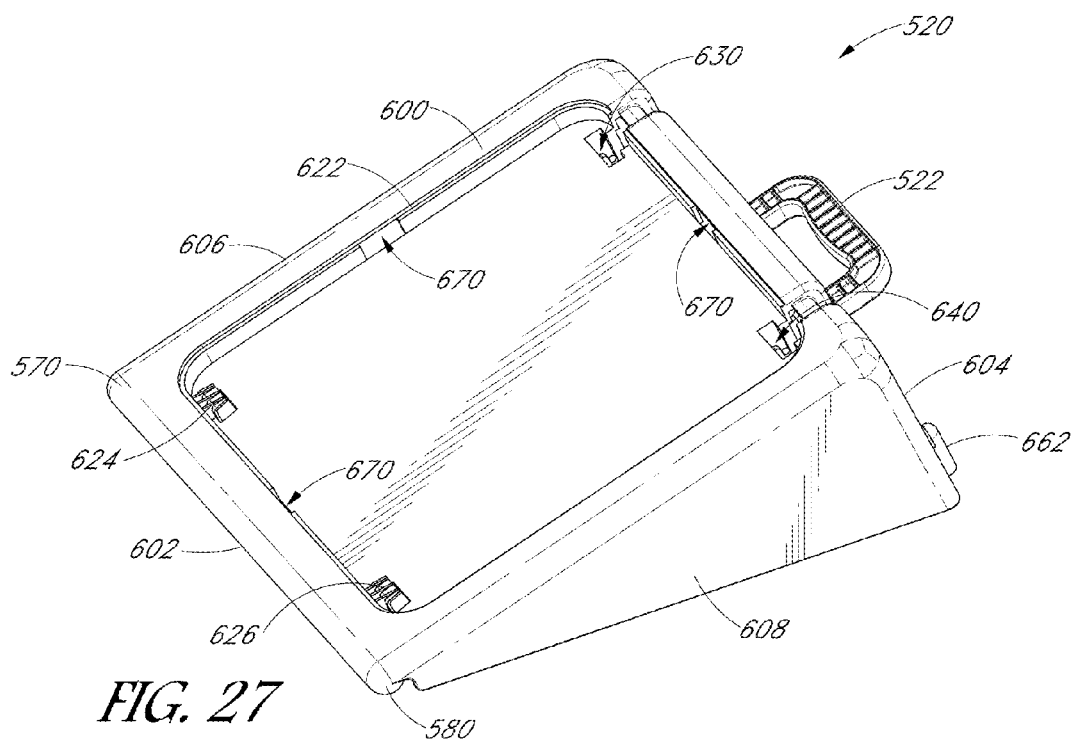
FIG. 27 illustrates an upper right front perspective view of the outer shell of the support structure of FIGS. 18-26.
Figure 55:
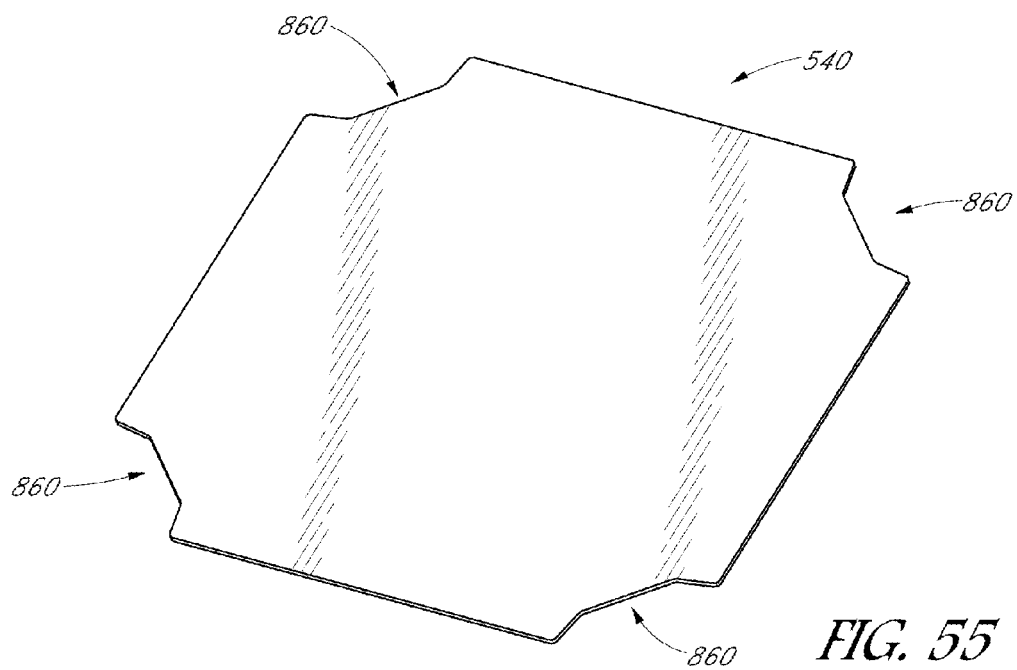
FIG. 55 illustrates an upper perspective view of the lower planar support pad of FIG. 26.
Figure 56:
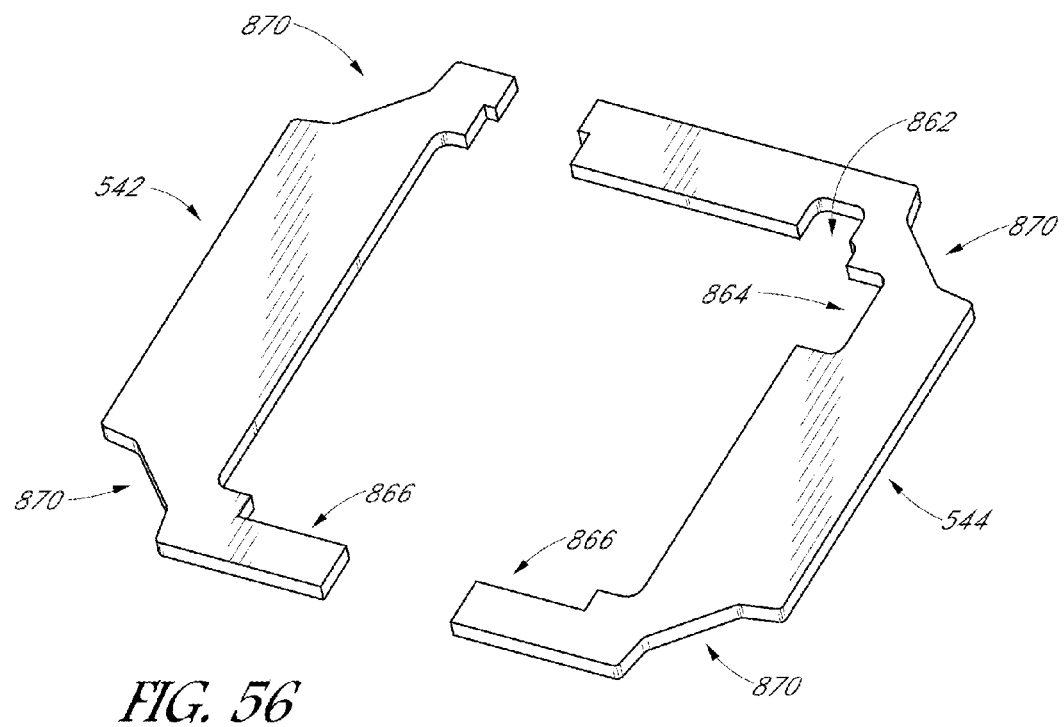
FIG. 56 illustrates an upper perspective view of the upper left support pad and the upper right support pad of FIG. 26.

As shown in the exploded view of FIG. 26, the upper cavity 620 of the outer shell 520 receives the lower planar support pad 540 (also shown in FIG. 55). The upper left support pad 542 and the upper right support pad 544 (also shown in FIG. 56) are positioned on top of the lower planar support pad. The faceplate 510 is then positioned on top of the upper left and upper right support pads. The support pads function to position and cushion the electronic device (e.g., the device 272 in FIGS. 18 and 19). The upper left and upper right support pads reduce or preclude lateral movement of the electronic device. The upper left and upper right support pads have a common thickness selected to generally correspond to the thickness of the electronic device. Thus, the thickness of the two upper support pads can be adjusted for thicker or thinner electronic devices. The two upper support pads are separated at the distal ends near the middle to accommodate a conventional power/USB cable and connector near the distal middle of a conventional electronic device when in the portrait mode. The two upper support pads are split at the proximal end near the left to accommodate a headphone cable and jack. The locations of the splits can be modified for pads intended for electronic devices having different connector positions. The thickness of the lower planar support pad is selected in combination with the thickness of the upper support pads so that the overall thickness of the two layers of pads is substantially the same for each combination. For example, if the thickness of the upper pads is decreased to accommodate a thinner electronic device, the thickness of the lower planar pad is increased by a corresponding amount to provide the original overall thickness. In the illustrated example, the combined thicknesses of the lower planar support pad and the upper support pads is approximately 15 millimeters, which corresponds to the depth of the upper cavity of the outer shell from the ledge 622 to the lower surface of the upper cavity. Together, the lower support pad, the upper left support pad, the upper right support pad and the faceplate 510 comprise a positioning structure for a manually accessible apparatus (e.g., the electronic device 272 in the illustrated embodiment). The positioning structure in the embodiment of FIGS. 18-65 is similar to the previously described support structure of the embodiments of FIGS. 1-17; however, the positioning structure mechanically engages the electronic device or other apparatus to secure the apparatus to the support structure rather than relying only on frictional engagement.

The lower support pad 540 is generally square with angular notches 860 formed in each corner to accommodate the engagement latches of the faceplate 510 (described below). The upper left support pad 542 and the upper right support pad 544 include similar notches 870 in the corners. The upper right support pad further includes an extended distal notch 872 to accommodate a switch at the upper right corner of the electronic device 272 and an upper right notch 874 to accommodate other switches. Each of the upper left support pad and the upper right support pad includes a proximal notch 876 to provide clearance around the sound outlets of the electronic device. The notches may be located in other portions of either or both upper pads for other electronic devices.

Figure 57:
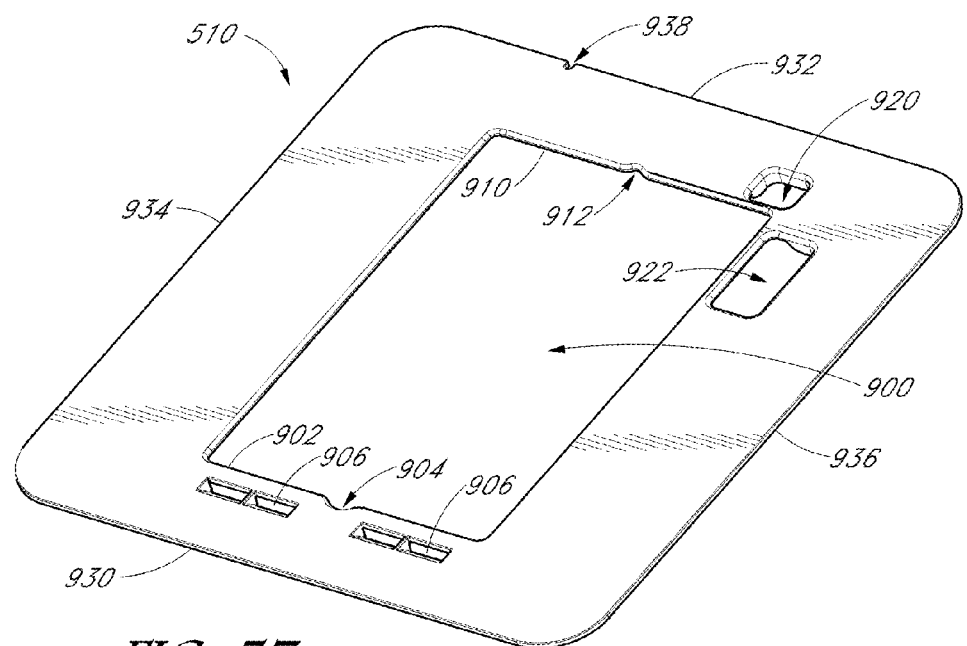
FIG. 57 illustrates a perspective view of the top surface of the faceplate of FIG. 26.
Figure 58:
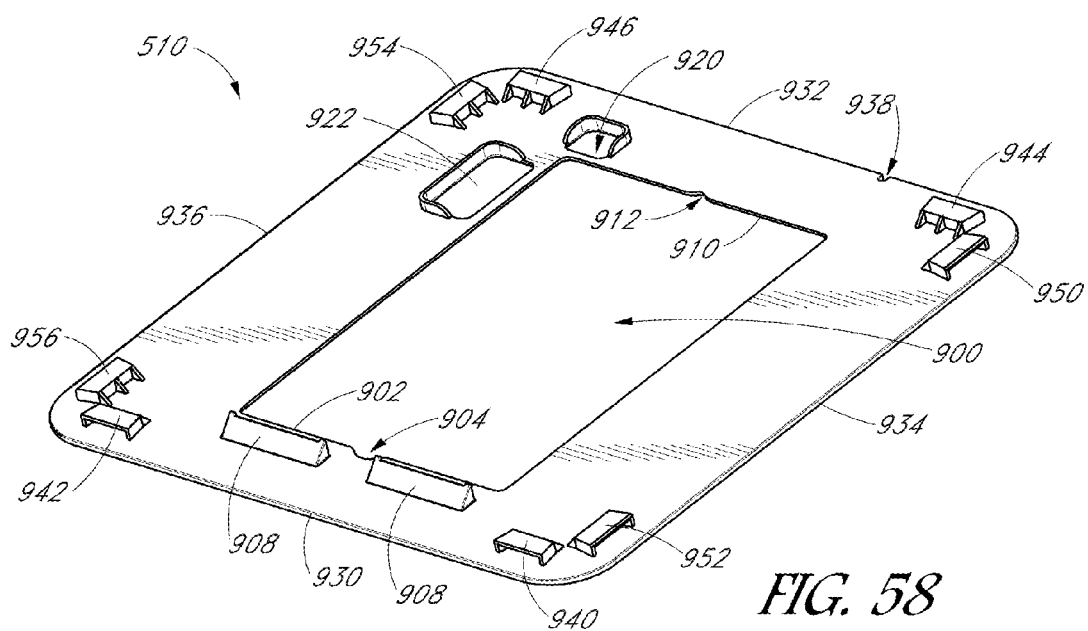
FIG. 58 illustrates a perspective view of the bottom surface of the faceplate of FIG. 57.

After positioning the pads 540, 542, 544 in the upper cavity 620 of the top surface 600 of the outer shell 520, as described above, the electronic device 272 is positioned between the left upper pad and the right upper pad. The faceplate 510 is then positioned on the ledge 622 in the upper portion of the upper cavity above the left and right upper pads and above the electronic device. As shown in FIGS. 57 and 58, the outer dimensions of the faceplate are square to fit within the ledge. For example, in the illustrated embodiment, the faceplate has sides with lengths of slightly less than 329 millimeters so that the outer perimeter of the faceplate rests upon the ledge. The faceplate has a generally rectangular central opening 900 between an upper surface 902 (FIG. 57) and lower surface 904 (FIG. 58) that is smaller than the outer dimensions of the electronic device such that only the display area of the electronic device appears through the central opening. The portions of the faceplate surrounding the central opening engage the bezel around the display of the electronic device and constrain the electronic device within the upper cavity. The central opening of the faceplate has a proximal edge 906 that includes a semicircular cutout 908 to accommodate the actuator switch on the electronic device. The faceplate further includes a pair of rectangular openings 910 proximal to the proximal edge of the central opening. The rectangular openings are the upper ends of respective 90-degree conduits 912 (FIG. 57). The conduits have lower ends positioned to redirect the sound emanating from the distal end of the electronic device upward through the faceplate. The distal notches 876 on the upper left pad 542 and the right upper pad 544 provide clearance for the conduits when the faceplate is positioned over the upper pads.

The central opening 900 of the faceplate 510 has a distal edge 914, which has a semicircular opening 916 to provide clearance for a camera lens on the electronic device. The faceplate also has an opening 920 and an opening 922, which are positioned to provide access to the switches at right end of the proximal edge of the electronic device 272 and the switches at the proximal end of the right side of the electronic device. The two openings are aligned with the notches 872, 874 of the right upper pad 544.

The faceplate 510 includes a proximal outer edge 930, a distal outer edge 932, a left outer edge 934 and a right outer edge 936, with edges defined in the portrait orientation shown in FIG. 45. The faceplate has a semicircular opening 938 in the distal edge to accommodate a headphone cable.

It should be understood that the various features of the faceplate 510, the lower planar pad 540, the upper left pad 542 and the upper right pad 544 are configured to match a particular electronic device 272. The various features can be relocated and resized on interchangeable faceplates and pads to accommodate electronic devices having different sizes and shapes and having switches and connectors in different locations. Additional openings can be provided to provide access to additional switches and connectors. The faceplate and the pads can be interchanged without requiring any changes to the underlying outer shell 520 and inner shell 530.

As shown in FIG. 57, the lower surface 904 of the faceplate 510 includes four pairs of latch engagement sockets. A first engagement socket 940 and a second engagement socket 942 are located near the proximal outer edge 930 of the faceplate. A third engagement socket 944 and fourth engagement socket 946 are located near the distal outer edge 932 of the faceplate. A fifth engagement socket 950 and a sixth engagement socket 952 are located near the left outer edge 934 of the faceplate. A seventh engagement socket 954 and an eighth engagement socket 956 are located near the right outer edge 936. The engagement sockets are positioned on the faceplate so that the rotationally symmetrical faceplate can be positioned on the ledge 622 of the upper cavity 620 of the outer shell 520 in any of four different orientations in accordance with the orientation of the electronic device 272. The notches 870 of the upper left support pad 542 and the upper right support pad 544 and the notches 860 of the lower planar support pad 540 provided clearance for the engagement sockets when the faceplate is positioned over the upper support pads.

When the faceplate 510 is positioned on the ledge 622 of the upper cavity 620 of the outer shell 520 in the portrait orientation shown in FIG. 18, the first engagement socket 940 engages the left engagement bracket 624 in the upper cavity, and the second engagement socket 942 engages the right engagement bracket 626. The third engagement socket 944 engages the left faceplate latch 550 and the fourth engagement socket 946 engages the right engagement latch 552. The operations of the two engagement latches are described below. In the portrait orientation, the fifth, sixth, seventh and eighth engagement sockets 950, 952, 954, 956 are not used.

When the faceplate is positioned on the ledge 622 in the landscape orientation as shown in FIG. 19, the fifth engagement socket 950 engages the left engagement bracket 624 and the sixth engagement socket 952 engages the right engagement bracket 626. The seventh engagement socket 954 engages the left engagement latch 550 and the eighth engagement socket 956 engages the right engagement latch 552. In the portrait orientation, the first, second, third and fourth engagement sockets 940, 942, 944, 946 are not used.

The positions of the engagement latches on the faceplate 510 also allow the faceplate to be positioned in two additional orthogonal orientations by turning the faceplate 180 degrees from each of the two orientations described above.

Figure 59:
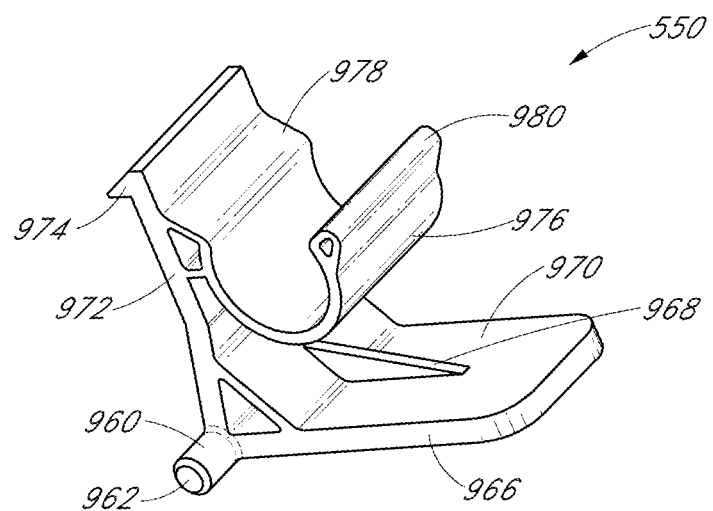
FIG. 59 illustrates a distal perspective view of the left faceplate latch of FIG. 26, the right faceplate latch of FIG. 26 being the same as the left faceplate latch.
Figure 60:
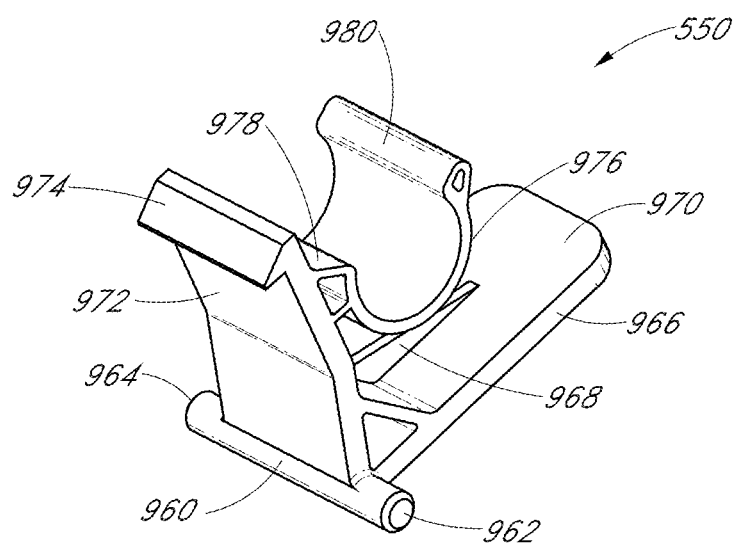
FIG. 60 illustrates a proximal perspective view of the faceplate latch of FIG. 59.

The left faceplate latch 550 is shown in a front perspective view in FIG. 59 and in a rear perspective view in FIG. 60. The right faceplate latch 552 is identical to the left faceplate latch. The faceplate latch includes a pivot 960 that extends from a first end 962 to a second end 964. An actuator tab 966 extends outward from the pivot. The actuator tab is reinforced with a rib 968 on a first surface 970. A latch tab 972 also extends from the pivot at an acute angle with respect to the actuator tab. A latch protrusion 974 extends perpendicularly from a distal end of the latch. The latch protrusion extends in the opposite direction from the actuator tab. A C-spring 976 has a first end 978 connected to the opposite side of the latch tab from the latch protrusion. A second free (unconnected) end 980 of the C-spring is positioned away from the latch tab in the general direction of the actuator tab.

Figure 61:
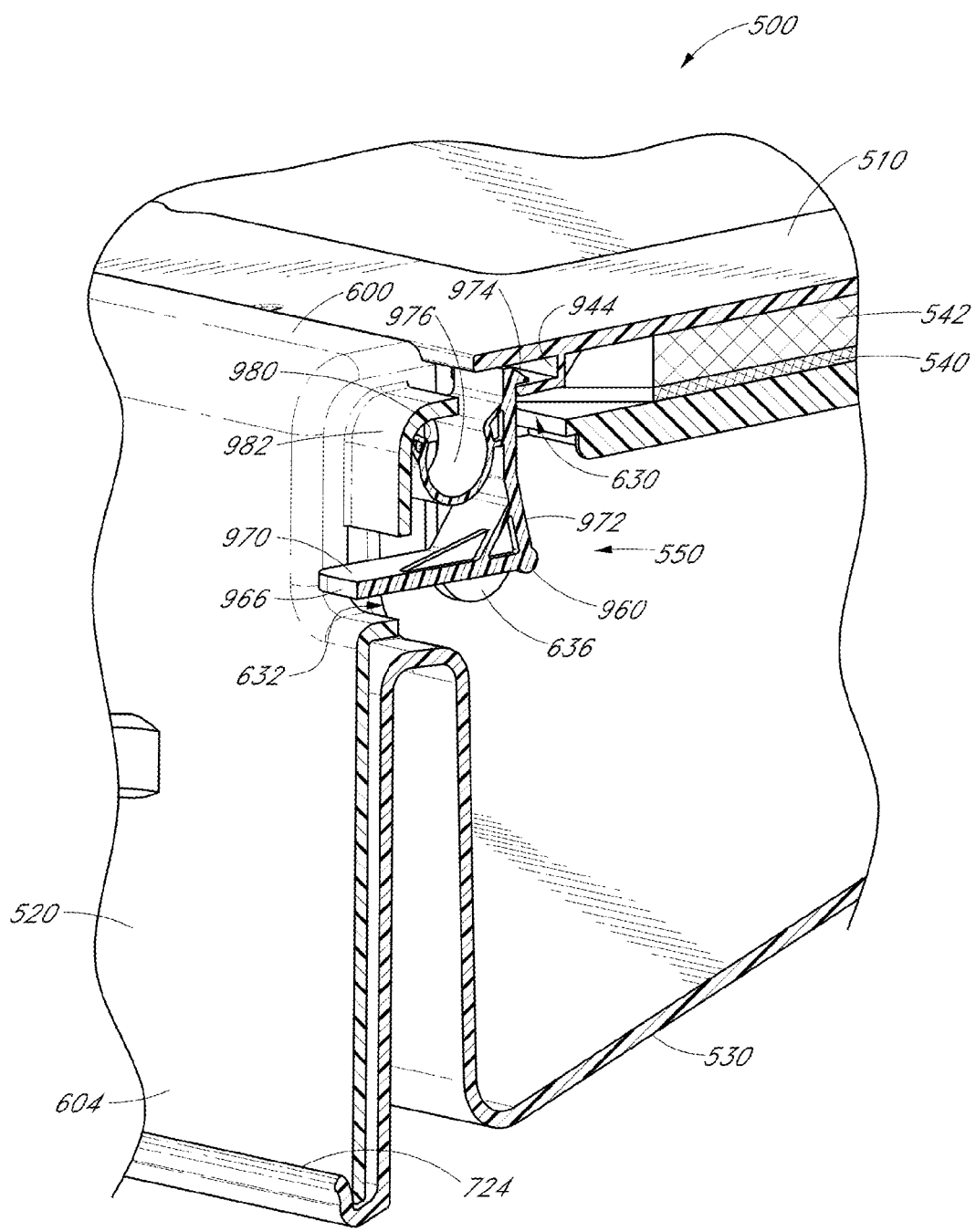
FIG. 61 illustrates an enlarged cross-sectional perspective view of the left distal corner of the support structure of FIG. 18 showing the positioning of the left faceplate latch of FIGS. 59 and 60 with respect to the faceplate.

As shown in the partial cross-sectional view of FIG. 61, the first end 962 of the pivot 960 of the left faceplate latch 550 is inserted into the bore 638 (FIG. 30) of the second left support pier 636. The second end 962 of the pivot is inserted into the bore 638 of the first left support pier 634 (shown in FIG. 30). The support piers are sufficiently resilient to allow the piers to spread apart so that the ends of the pivot can be inserted in the bores and then return to a parallel configuration to retain the pivot ends in the bores. The left faceplate latch is positioned with the actuator tab 966 extending distally through the second left faceplate latch opening 632 in the rear wall 604 of the outer shell 520. The latch tab 972 extends upward through the first left faceplate latch opening 630 into the upper cavity 620. The protrusion 974 engages the third engagement socket 944 on the distal edge of the faceplate 510. The protrusion has a sloped upper edge so that when the faceplate is inserted into the upper cavity, the protrusion is pushed away from the socket initially and then snaps back into engagement with the socket. The second end 980 of the C-spring 976 is positioned against the inner surface of an inset portion 982 of the outer shell to provide compression force to maintain the protrusion in engagement with the socket. The second faceplate latch 550 (not shown in FIG. 61) is oriented and installed in a similar manner with the respective pivot ends 962, 966 in the bores 648 of the second right support pier 646 and the first right support pier 644.

When the actuator tabs 964 of the left faceplate latch 550 and the right faceplate latch 552 are pressed downward, the respective latch tabs 972 move away from the respective third and fourth engagement sockets 944, 946 of the faceplate 510 against the forces of the respective C-springs 976. The respective protrusions 974 of the latch tabs are disengaged from the respective sockets to allow the faceplate to be removed from the upper cavity 620. The faceplate is installed in the upper cavity in the portrait orientation by first engaging the first engagement socket 940 with the left engagement bracket 624 of the upper cavity and engaging the second engagement socket 942 with the right engagement bracket 626 of the upper cavity. The third engagement socket and the fourth engagement sockets are then snapped into engagement with the protrusions of the latch tabs as described above. The faceplate is installed in the landscape orientation in a similar manner using the fifth and sixth engagement sockets 950, 952 and the seventh and eighth engagement sockets 954, 956.

The faceplate 510 retains the electronic device 272 securely in the upper cavity 620 of the outer shell 520 so that the support structure 500 can be safely transported using the handle 530 without fear of the electronic device falling out of the upper cavity.

Figure 62:
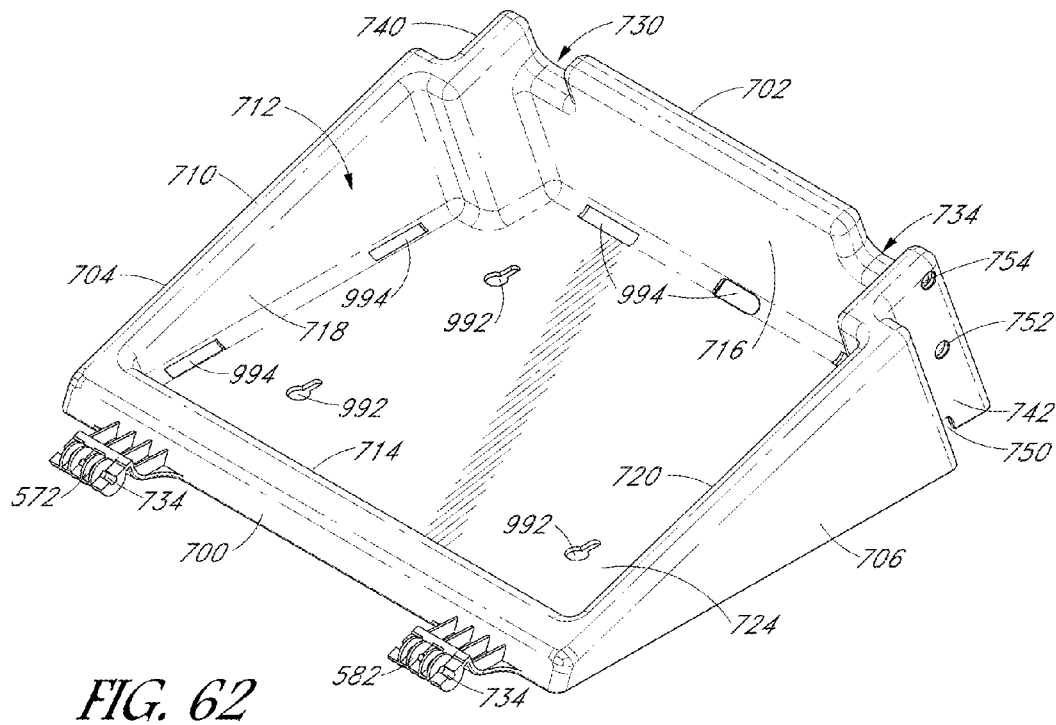
FIG. 62 illustrates an upper perspective view of a modified inner shell having mounting openings to receive screws or other fasteners for storage and having openings to received carrying straps for transporting the support structure.
Figure 63:
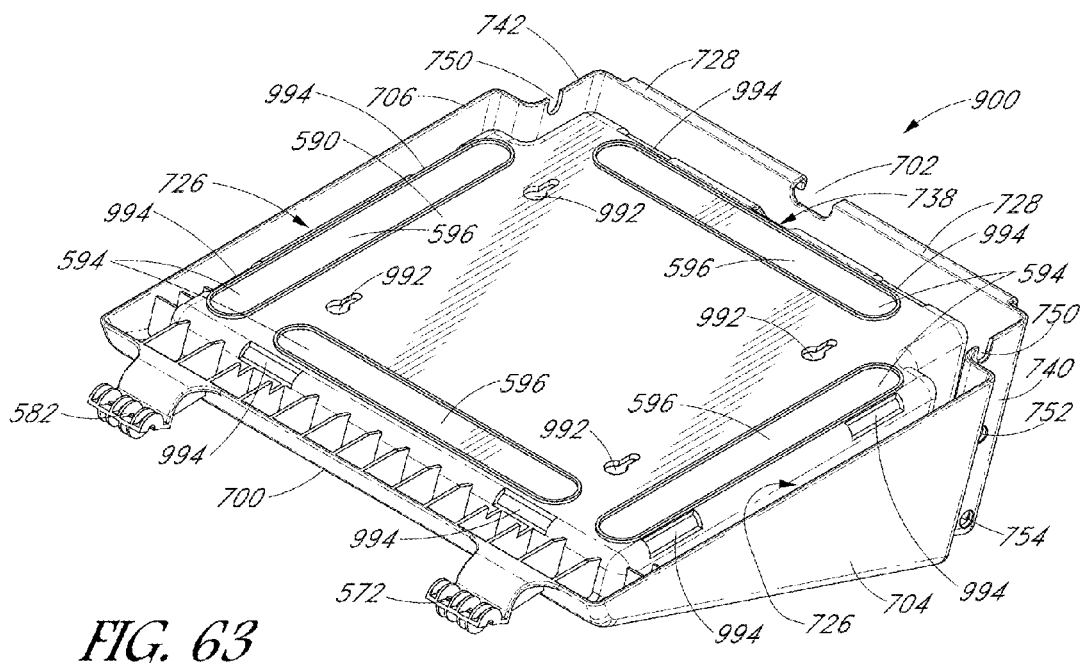
FIG. 63 illustrates a lower perspective view of the modified inner shell of FIG. 62.

FIGS. 62 and 63 illustrate an upper perspective view and a lower perspective view of a modified embodiment of an inner shell 990. The modified inner shell has substantially the same construction as the previously described inner shell; and corresponding elements are identified as before. The modified inner shell is connectable to the outer shell 520 as described above. The modified inner shell further includes a plurality (e.g., four) of keyhole-shaped mounting openings 992 formed through the bottom surface 590 of the inner shell into the upper cavity 712. The mounting openings are arranged in a pattern to allow the support structure 500 to be mounted onto a wall or other surface for storage. The narrow slot portions of the openings are oriented toward the distal (rear) wall 702 of the inner shell such that when the inner shell (and thus the overall support structure 500) is mounted on a wall (not shown), the distal wall is oriented upward. Thus, the handle 522 (shown in the other figures) is oriented upward to facilitate moving the support structure to and from a wall mounting location.

As further illustrated in FIGS. 62 and 63, the modified inner shell 900 further includes a plurality of generally rectangular openings 994 that extend into the upper cavity 712 at the intersections of the upper cavity floor 724 with each of the inner walls 714, 716, 718, 720. In the illustrated embodiment, each intersection of a wall and the cavity floor includes two rectangular openings. The rectangular openings provide access for one or more carrying straps (not shown) so that the support structure can be configured to be transported like a backpack. By providing openings at each intersection, a user of the support structure has the option of configuring the carrying straps in various configurations.

Figure 64:
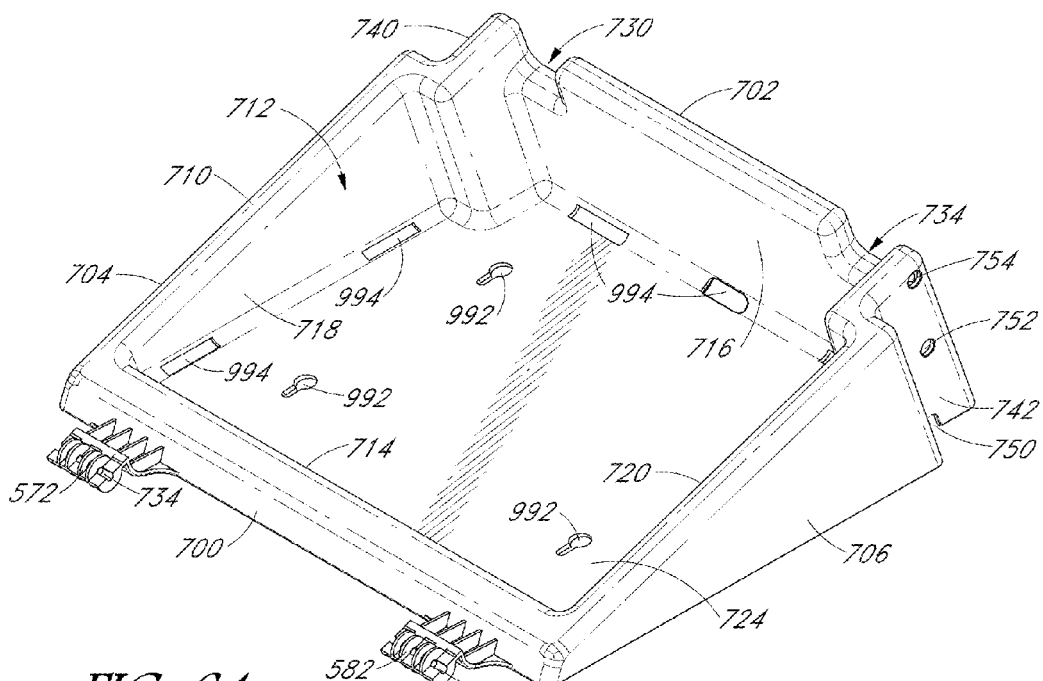
FIG. 64 illustrates an upper perspective view of the modified inner shell of FIGS. 62 and 63 with the keyhole-shaped mounting openings oriented for mounting the inner shell on a wall with the distal (rear) surface facing downward.
Figure 65:
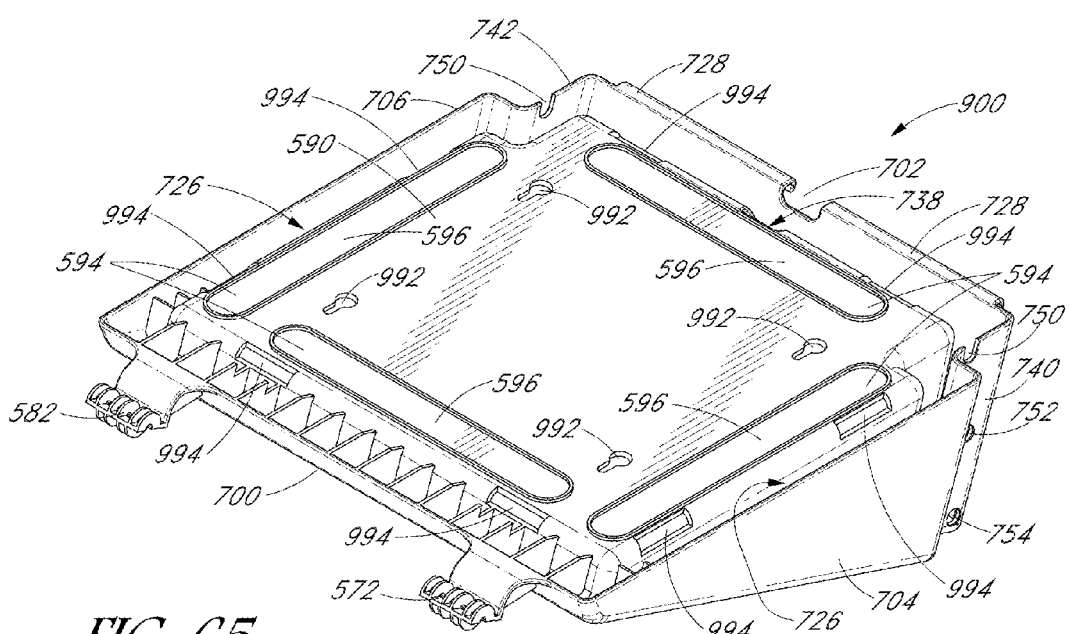
FIG. 65 illustrates a lower perspective view of the modified inner shell of FIG. 64.

FIGS. 64 and 65 illustrate an upper perspective view and lower perspective view of the modified inner shell 900 of FIGS. 62 and 63 in which the orientation of the keyhole-shaped mounting openings 992 are reversed such that the narrow slot portions of the openings are directed toward the front wall 700 of the inner shell. When the embodiment of FIGS. 64 and 65 is mounted on a wall (not shown), the distal wall 702 is oriented downward. Accordingly, the support structure 500 is mounted with the upper surface 600 facing outward and upward from the wall. In this orientation with the electronic device 272 of FIGS. 18 and 19 oriented 180 degrees from one of the two orientations shown in FIGS. 18 and 19, the electronic device can be easily accessed by a person facing the support structure from either a standing or a sitting position. In a further version (not shown) of the modified inner shell, the keyhole-shaped mounting openings can have narrow slot portions extending in both directions from the round opening so that the modified inner shell can be mounted on the wall with either the proximal (front) wall 700 or the distal (rear) wall facing downward.

As described above, the faceplate 510 and the support pads 540, 542, 544 of the support structure 500 are easily adaptable to conform to the sizes and shapes of different types and models of electronic devices such as tablet computers, smartphones, and the like without requiring any modification of the underlying outer shell 520 or inner shell 530 of the support structure. The faceplate and the support pads may also be adapted to accommodate other manually accessible devices. For example, the faceplate and the support pads may be sized and shaped to accommodate a base platform for a set of interlocking building blocks (e.g., LEGO® brand building bricks and the like), to accommodate a whiteboard (e.g., a dry-erase board) or a chalkboard, to accommodate a jigsaw puzzle board, and to accommodate other nominally flat structures or platforms.

The support structure 500 described above can also be fixedly mounted to a desk or other platform using the keyhole-shaped mounting openings 992 showing in FIGS. 62-65. For example, the outer shell 520 can be rotated fully away from the inner shell 530 to provide access to the mounting openings so that screws can be inserted into the narrow portions of the mounting openings and tightened to secure the support structure to the platform. This feature may be used to attach the support structure to a set of legs extending from such a platform so that the support structure is converted to a free-standing system.

As various changes could be made in the above constructions without departing from the scope of the invention, it is intended that all the matter contained in the above description or shown in the accompanying drawings shall be interpreted as illustrative and not in a limiting sense.

I claim:

1. A support structure for a portable electronic device that retains the portable electronic device in at least two orientations, the support structure comprising:
    a base, wherein the base comprises:
        a lower base portion that rests on a flat surface; and
        an upper base portion that engages the lower base portion;
    a front wall, a rear wall, a left side wall and a right side wall that extend upwardly from the base, the front wall being shorter than the rear wall;
    an upper surface supported by the front wall, the rear wall, the left side wall and the right side wall, the upper surface sloping downward from the rear wall toward the front wall such that the upper surface is at a presentation angle with respect to the base;
    a positioning structure receiving recess formed in the upper surface, the positioning structure receiving recess having a selected shape; and
    a device positioning structure configured to be positioned in the positioning structure receiving recess, the device positioning structure including a device receiving opening having a shape configured to conform to the portable electronic device, the device positioning structure configured to be positioned in the positioning structure receiving recess to provide at least two orientations for the device receiving opening with respect to the front wall such that the portable electronic device is configured to be positioned in at least two corresponding orientations with respect to the front wall.

2. The support structure as defined in claim 1, wherein:
    the device positioning structure has a substantially rectangular shape;
    the device receiving opening is positioned substantially in the center of the substantially square shape, the device receiving opening being generally rectangular with a length and a width, the width shorter than the length; and
    the device positioning structure is configured to be positioned in the positioning structure receiving recess in a first orientation and is configured to be positioned in the positioning structure receiving recess in a second orientation.

3. The support structure as defined in claim 1, wherein:
    the device positioning structure has a substantially rectangular shape, the device positioning structure comprising an outer structure portion and an inner structure portion, the outer structure portion having a central opening formed therein, the inner structure portion having an outer perimeter sized and shaped to conform to and fit within the central opening of the outer frame portion;
    the device receiving opening is positioned substantially in the center of the inner structure portion, the device receiving opening being generally rectangular with a length and a width, the width shorter than the length; and
    the inner structure portion is configured to be positioned within the outer structure portion in at least a first orientation and at least a second orientation.

4. The support structure as defined in claim 1, wherein:
the lower base portion includes at least one lower recess; and
a non-skid pad is removably insertable within the at least one lower recess of the lower base portion to enhance the frictional engagement of the lower base portion with the flat surface.

5. The support structure as defined in claim 1, wherein:
the lower base portion comprises an extended upper portion; and
an upper base portion includes a lower recess, the lower recess of the upper base portion sized and shaped to engage the extended upper portion of the lower base portion.

6. A support structure for a portable electronic device that retains the portable electronic device in at least two orientations, the support structure comprising:
a base;
a front wall, a rear wall, a left side wall and a right side wall that extend upwardly from the base, the front wall being shorter than the rear wall;
an upper surface supported by the front wall, the rear wall, the left side wall and the right side wall, the upper surface sloping downward from the rear wall toward the front wall such that the upper surface is at a presentation angle with respect to the base, wherein the presentation angle is in a range of approximately 5-45 degrees;
a positioning structure receiving recess formed in the upper surface, the positioning structure receiving recess having a selected shape; and
a device positioning structure configured to be positioned in the positioning structure receiving recess, the device positioning structure including a device receiving opening having a shape configured to conform to the portable electronic device, the device positioning structure configured to be positioned in the positioning structure receiving recess to provide at least two orientations for the device receiving opening with respect to the front wall such that the portable electronic device is configured to be positioned in at least two corresponding orientations with respect to the front wall.

7. The support structure as defined in claim 6, wherein the presentation angle is in a range of approximately 10-15 degrees.

8. The support structure as defined in claim 6, wherein the presentation angle is variable between a lowest presentation angle and a highest presentation angle by rotating the upper surface with respect to the base.

9. The support structure as defined in claim 6, wherein the presentation angle is selectively fixed at one of three presentation angles, including the lowermost presentation angle, the uppermost presentation angle and a middle presentation angle.

10. A support structure for a portable electronic device that retains the portable electronic device in at least two orientations, the support structure comprising:
a base;
a front wall, a rear wall, a left side wall and a right side wall that extend upwardly from the base, the front wall being shorter than the rear wall;
an upper surface supported by the front wall, the rear wall, the left side wall and the right side wall, the upper surface sloping downward from the rear wall toward the front wall such that the upper surface is at a presentation angle with respect to the base;
a positioning structure receiving recess formed in the upper surface, the positioning structure receiving recess having a selected shape; and
a device positioning structure configured to be positioned in the positioning structure receiving recess, the device positioning structure including a device receiving opening having a shape configured to conform to the portable electronic device, the device positioning structure configured to be positioned in the positioning structure receiving recess to provide at least two orientations for the device receiving opening with respect to the front wall such that the portable electronic device is configured to be positioned in at least two corresponding orientations with respect to the front wall, wherein:
the device positioning structure has an upper surface; and
the device receiving opening has a depth with respect to the upper surface of the device positioning structure selected to position an exposed upper surface of the portable electronic device substantially flush with the upper surface of the device positioning structure.

11. A support structure for a portable electronic device that retains the portable electronic device in at least two orientations, the support structure comprising:
a base;
a front wall, a rear wall, a left side wall and a right side wall that extend upwardly from the base, the front wall being shorter than the rear wall;
an upper surface supported by the front wall, the rear wall, the left side wall and the right side wall, the upper surface sloping downward from the rear wall toward the front wall such that the upper surface is at a presentation angle with respect to the base;
a positioning structure receiving recess formed in the upper surface, the positioning structure receiving recess having a selected shape; and
a device positioning structure configured to be positioned in the positioning structure receiving recess, the device positioning structure including a device receiving opening having a shape configured to conform to the portable electronic device, the device positioning structure configured to be positioned in the positioning structure receiving recess to provide at least two orientations for the device receiving opening with respect to the front wall such that the portable electronic device is configured to be positioned in at least two corresponding orientations with respect to the front wall, wherein the device positioning structure comprises:
at least one pad defining an opening to receive the device within the opening; and
a faceplate configured to be positioned over the at least one pad and engageable with the upper surface of the support structure, the faceplate having a faceplate opening sized smaller than the opening in the at least one pad, the faceplate having a frame around the faceplate opening sized to contact an upper surface of the device to secure the device within the positioning structure receiving recess of the upper surface.

* * * * *